US012595553B2

(12) United States Patent
Boulanger et al.

(10) Patent No.: US 12,595,553 B2
(45) Date of Patent: Apr. 7, 2026

(54) SYSTEM AND METHOD FOR CONTROLLING FILM THICKNESS, AND FILM DEPOSITION SYSTEM AND METHOD USING SAME

(71) Applicant: ANGSTROM ENGINEERING INC., Kitchener (CA)

(72) Inventors: Jonathan Boulanger, Burlington (CA); David Pitts, Guelph (CA); Andrew Campbell, Kitchener (CA); Erik Smith, Woodstock (CA); Paul Clarke, Guelph (CA); Timothy Brenner, Kitchener (CA); Mike Miller, Kitchener (CA); Craig Reynolds, Elora (CA)

(73) Assignee: ANGSTROM ENGINEERING INC., Kitchener (CA)

( * ) Notice: Subject to any disclaimer, the term of this patent is extended or adjusted under 35 U.S.C. 154(b) by 0 days.

(21) Appl. No.: 18/825,717

(22) Filed: Sep. 5, 2024

(65) Prior Publication Data

US 2024/0425971 A1     Dec. 26, 2024

Related U.S. Application Data

(63) Continuation of application No. 18/193,253, filed on Mar. 30, 2023, now abandoned, which is a (Continued)

(51) Int. Cl.
*C23C 14/54*          (2006.01)
*C23C 14/04*          (2006.01)
(Continued)

(52) U.S. Cl.
CPC .......... *C23C 14/542* (2013.01); *C23C 14/042* (2013.01); *C23C 14/044* (2013.01); (Continued)

(58) Field of Classification Search
None
See application file for complete search history.

(56) References Cited

U.S. PATENT DOCUMENTS 3,904,503 A * 9/1975 Hanfmann .............. C23C 14/34
                                                    427/523
4,430,790 A * 2/1984 Ohta .................. H10N 60/0912
                                                    427/63
(Continued)

FOREIGN PATENT DOCUMENTS

CA        2254460 A1     5/2000
JP        2012046803 A   3/2012
WO        2022067433 A1  4/2022

OTHER PUBLICATIONS

International Searching Authority, International Search Report and Written Opinion issued in Application No. PCT/CA2021/051361, 15 pages, dated Dec. 30, 2021.
(Continued)

*Primary Examiner* — Parviz Hassanzadeh
*Assistant Examiner* — Margaret Klunk
(74) *Attorney, Agent, or Firm* — Gray Ice Higdon

(57)          ABSTRACT

Described are various embodiments of a system and method for controlling film thickness, and a film deposition system and method using same. In one such embodiments, a vapour deposition system for spatially controlling a deposited film thickness on a substrate comprises: an emission source; a substrate holder; and a translatable shutter comprising a flux barrier disposed between said emission source and the substrate and operable to translate said flux barrier through a deposition flux according to a designated linear translation profile designated to spatially control the deposited film thickness.

18 Claims, 22 Drawing Sheets

Related U.S. Application Data continuation-in-part of application No. PCT/CA2021/051361, filed on Sep. 29, 2021.

(60) Provisional application No. 63/085,328, filed on Sep. 30, 2020.

(51) Int. Cl.

| | |
|---|---|
| *C23C 14/14* | (2006.01) |
| *C23C 14/16* | (2006.01) |
| *C23C 14/22* | (2006.01) |
| *C23C 14/24* | (2006.01) |
| *C23C 14/50* | (2006.01) |
| *C23C 16/455* | (2006.01) |
| *H01L 21/285* | (2006.01) |
| *H01L 21/67* | (2006.01) |

(52) U.S. Cl.
CPC .............. *C23C 14/14* (2013.01); *C23C 14/16* (2013.01); *C23C 14/225* (2013.01); *C23C 14/24* (2013.01); *C23C 14/50* (2013.01); *H01L 21/67017* (2013.01); *C23C 16/45589* (2013.01); *H01L 21/2855* (2013.01)

(56) References Cited

U.S. PATENT DOCUMENTS

| | | | |
|---|---|---|---|
| 4,858,556 A | | 8/1989 | Siebert |
| 6,086,727 A * | | 7/2000 | Pinarbasi ............ H01J 37/3178 |
| | | | 204/192.15 |
| 7,062,348 B1 * | | 6/2006 | Folta ..................... C23C 14/044 |
| | | | 700/118 |
| 7,435,300 B2 | | 10/2008 | Ling et al. |
| 8,968,829 B2 | | 3/2015 | Ryu et al. |
| 2002/0139666 A1 * | | 10/2002 | Hsueh ................... C23C 14/547 |
| | | | 204/298.03 |
| 2002/0162740 A1 * | | 11/2002 | Wang .................... C23C 14/027 |
| | | | 118/723 VE |
| 2003/0087033 A1 * | | 5/2003 | Ramsay .................. C23C 14/12 |
| | | | 118/723 VE |
| 2005/0045091 A1 * | | 3/2005 | Kawasaki ............... C30B 29/42 |
| | | | 117/89 |
| 2007/0178708 A1 * | | 8/2007 | Ukigaya ............... C23C 14/044 |
| | | | 438/758 |
| 2008/0199609 A1 * | | 8/2008 | Kuan .................... C23C 14/044 |
| | | | 427/248.1 |
| 2013/0206583 A1 * | | 8/2013 | Druz .................... C23C 14/221 |
| | | | 204/192.11 |
| 2013/0299345 A1 | | 11/2013 | Abarra et al. |
| 2015/0179916 A1 * | | 6/2015 | Pramanik .............. H10N 60/12 |
| | | | 505/190 |
| 2017/0198387 A1 | | 7/2017 | Matsunaga et al. |
| 2020/0019068 A1 | | 1/2020 | Brink et al. |
| 2021/0020484 A1 * | | 1/2021 | Miller .............. H01L 21/68764 |
| 2024/0401186 A1 * | | 12/2024 | Boulanger ............. C23C 14/14 |

OTHER PUBLICATIONS

European Patent Office; Extended European Search Report issued for Application No. 21873767.4, 13 pages, dated May 15, 2025.

* cited by examiner

1

SYSTEM AND METHOD FOR CONTROLLING FILM THICKNESS, AND FILM DEPOSITION SYSTEM AND METHOD USING SAME

CROSS REFERENCE TO RELATED APPLICATIONS

This application is a continuation of U.S. patent application Ser. No. 18/193,253 filed Mar. 30, 2023, which is a continuation-in-part of International Application No. PCT/CA2021/051361 filed Sep. 29, 2021, which claims priority to U.S. Provisional Application No. 63/085,328 filed Sep. 30, 2020, the entire disclosure of each of which is hereby incorporated herein by reference.

FIELD OF THE DISCLOSURE

The present disclosure relates to thin film fabrication, and, in particular, to a system and method for controlling film thickness, and film deposition system and method using same.

BACKGROUND

The fabrication of highly sensitive circuits often relies on the generation of thin, very high purity layers deposited on a substrate using physical vapor deposition (PVD) with evaporative sources in a high vacuum environment. For many applications, such as the deposition of superconducting circuits for quantum computing, fabrication processes may further require control over PVD system geometries within the vacuum chamber, including the provision of specific tilt angles of a substrate relative to a particle beam axis.

For instance, the Josephson Junction (JJ) is a superconducting circuit element commonly used in quantum computing applications that is fabricated with PVD performed at specific angles. JJs are typically fabricated by overlaying different materials at specific locations on a substrate using a shadow mask which exposes the substrate to different materials based on the orientation of the substrate relative to a beam axis. While different PVD techniques exist for the fabrication of JJs using various shadow mask designs, such as the Dolan technique, the Manhattan crossing, or software-corrected mask designs such as that disclosed by United States Patent Application No. 20/0,019,068 published Jan. 16, 2020 to Marcus Brink, et al., the geometry of systems employing such tilt angles results in a non-uniform film thickness across the substrate, which can significantly impact the performance of ultra-thin films, and the scalability and reproducibility of fabrication thereof.

Conversely, various approaches have been proposed to minimise non-uniformity in deposited films. For instance, U.S. Pat. No. 8,968,829 published Mar. 3, 2015 to Jae-Kwang Ryu, et al. and entitled "Thin film deposition apparatus and method of manufacturing organic light-emitting display device by using the same" discloses a PVD system for LED display fabrication that employs a patterned slit mask, wherein film uniformity is improved by depositing material on a substrate through the mask, then moving the substrate relative to the emission source for subsequent deposition. U.S. Pat. No. 7,435,300 published Oct. 14, 2008 to Kow-Je Ling and Jiunn-Shiuh Juang and entitled "Dynamic film thickness control system/method and its utilization" discloses a film thickness control system in which a clear substrate is moved behind a mask once a designated film thickness is detected. Such systems, however, do not employ substrate tilt angles.

This background information is provided to reveal information believed by the applicant to be of possible relevance. No admission is necessarily intended, nor should be construed, that any of the preceding information constitutes prior art or forms part of the general common knowledge in the relevant art.

SUMMARY

The following presents a simplified summary of the general inventive concept(s) described herein to provide a basic understanding of some aspects of the disclosure. This summary is not an extensive overview of the disclosure. It is not intended to restrict key or critical elements of embodiments of the disclosure or to delineate their scope beyond that which is explicitly or implicitly described by the following description and claims.

A need exists for a system and method for controlling film thickness, and film deposition systems and methods using same, that overcome some of the drawbacks of known techniques, or at least, provide a useful alternative thereto. Some aspects of this disclosure provide examples of such systems and methods.

In accordance with one aspect, there is provided a vapour deposition system for spatially controlling a deposited film thickness on a substrate, the vapour deposition system comprising: an emission source; a substrate holder; and a translatable shutter comprising a flux barrier disposed between the emission source and the substrate and operable to translate the flux barrier through a deposition flux according to a designated linear translation profile designated to spatially control the deposited film thickness.

In some embodiments, the substrate holder is configurable to position the substrate at a designated angle relative to a deposition flux axis, and wherein the designated linear translation profile is designated as a function of the designated angle.

In some embodiments, the designated linear translation profile comprises a non-uniform velocity profile.

In some embodiments, the non-uniform velocity profile corresponds to a spatially defined non-uniformity of deposition on the substrate.

In some embodiments, the linear translation profile is applied in accordance with a translation axis that is substantially perpendicular to the deposition flux.

In some embodiments, the flux barrier comprises a non-uniform width profile.

In some embodiments, the non-uniform width profile corresponds to one or more of a deposition system geometry or a substrate geometry.

In some embodiments, the flux barrier comprises a plurality of barrier modules, each of the plurality comprising a respective barrier geometry corresponding to a respective deposition system geometry.

In some embodiments, the translatable shutter further comprises an actuator operable to translate the flux barrier according to the designated linear translation profile.

In some embodiments, the system further comprises a digital data storage component having stored thereon the designated linear translation profile, the vapour deposition system further comprising a digital data processor operable to execute translation of the flux barrier via the actuator.

In some embodiments, the designated linear translation profile is designated to enhance a uniformity of the deposited film thickness.

In some embodiments, the enhanced uniformity is characterised by a non-uniformity of less than 1%.

In some embodiments, the enhanced uniformity comprises a uniformity enhancement relative to a baseline deposition layer uniformity.

In some embodiments, the flux barrier comprises a tapered rectangular portion disposed to translate between said emission source and the substrate to block a corresponding subsection of said deposition flux.

In some embodiments, the tapered rectangular portion comprises a curved leading edge at least partially defining a tapered width profile of said flux barrier.

In some embodiments, the tapered rectangular portion further comprises a curved tailing edge further defining said tapered width profile of said flux barrier to act as an opposed leading edge to operate said flux barrier as a bi-directional shutter.

In some embodiments, the leading edge and said tailing edge are defined by respective distinct curvatures.

In some embodiments, the rectangular portion is dimensioned and translatable to block an entirety of the substrate from said deposition.

In some embodiments, translation of said flux barrier according to said designated linear translation profile is triggered by one of an elapsed initial deposition time or a measured initial deposition accumulation.

In accordance with another aspect, there is provided a method for spatially controlling a film thickness deposited on a substrate using a vapour deposition system comprising an emission source and a substrate holder, the method comprising: emitting from the emission source a deposition material; and translating a flux barrier disposed between the emission source and the substrate through a deposition flux of the deposition material according to a designated linear translation profile designated to spatially control the deposited film thickness.

In some embodiments, the method further comprises angling the substrate at an angle relative to a deposition flux axis, and designating the designated linear translation profile according to the angle.

In some embodiments, the translating further comprises translating the flux barrier according to a non-uniform velocity profile.

In some embodiments, the method further comprises calculating the non-uniform velocity profile at least in part based on a spatially dependent rate of deposition on the substrate.

In some embodiments, the translating a flux barrier comprises translating the flux barrier in a translation axis direction that is perpendicular to an axis of propagation of the deposition flux.

In some embodiments, the method further comprises: selecting as the flux barrier, based on one or more of a deposition system geometry or a substrate geometry, a designated barrier from a plurality of respective flux barriers, each of the plurality comprising a respective barrier geometry corresponding to one or more of a designated deposition system geometry or a designated substrate geometry.

In some embodiments, the translating comprises actuating via one or more actuators translation of said flux barrier according to said designated linear translation profile.

In some embodiments, the method further comprises selecting as said designated linear translation profile, at least in part based on one or more of a deposition system geometry, a substrate geometry, or a deposition material, a given translation profile from a plurality of designated translation profiles.

In some embodiments, the controlling of the film thickness comprises depositing a uniform film thickness on the substrate.

In accordance with another aspect, there is provided a method of calibrating a vapour deposition system to control a film thickness deposited on a substrate using a vapour deposition system comprising an emission source and a substrate holder, the method comprising: depositing a film on a substrate using respective base deposition and dynamic deposition processes, wherein both of the respective base deposition and dynamic deposition processes comprise a common deposition system configuration, and wherein said dynamic deposition process comprises translating a flux barrier disposed between the emission source and the substrate through a deposition flux according to a test barrier translation profile; measuring respective base and dynamic deposition rate profiles corresponding to the respective base deposition and dynamic deposition processes; calculating, based at least in part on the respective base and dynamic deposition rate profiles, a designated barrier translation profile corresponding to the common deposition system configuration.

In some embodiments, the method further comprises: depositing a test film on a test substrate while translating the flux barrier according to the designated barrier translation profile; measuring a test deposition rate profile corresponding to the test film; and calculating, at least in part based on the test deposition rate profile, an updated designated barrier translation profile.

In some embodiments, the method further comprises repeating the depositing a test film, the measuring a test deposition rate, and the calculating an updated designated barrier translation profile until the test deposition rate profile corresponds with a desired film thickness profile.

In some embodiments, the desired film thickness profile comprises a designated film uniformity.

In some embodiments, the common deposition configuration comprises the substrate having a designated angle relative to a deposition flux axis.

In accordance with another aspect, there is provided a vapour deposition system for spatially controlling a deposited film thickness on a tilted substrate, the vapour deposition system comprising: an emission source; a substrate holder; and a translatable shutter comprising a flux barrier disposed between the emission source and the tilted substrate and operable to translate the flux barrier through a deposition flux according to a designated rotational translation profile designated to spatially control the deposited film thickness.

In some embodiments, the designated rotational translation profile comprises a uniform angular velocity.

In some embodiments, the rotational translation profile is applied in accordance with a rotational axis that is substantially parallel to said deposition flux.

In some embodiments, the flux barrier comprises a non-uniform width profile.

In some embodiments, the non-uniform width profile corresponds to one or more of a deposition system geometry or a substrate geometry.

In some embodiments, the flux barrier comprises a plurality of barrier modules, each of the plurality comprising a respective barrier geometry corresponding to a respective deposition system geometry.

In some embodiments, the translatable shutter further comprises an actuator operable to translate the flux barrier according to said designated rotational translation profile.

In some embodiments, the system further comprises a digital data storage component having stored thereon the designated rotational translation profile, the vapour deposition system further comprising a digital data processor operable to execute translation of the flux barrier via said actuator.

In some embodiments, the designated rotational translation profile is designated to enhance a uniformity of the deposited film thickness.

In some embodiments, the enhanced uniformity is characterised by a non-uniformity of less than 2.5%.

In some embodiments, the enhanced uniformity comprises a uniformity enhancement relative to a baseline deposition layer uniformity.

In accordance with another aspect, there is provided a method for spatially controlling a film thickness deposited on a tilted substrate using a vapour deposition system comprising an emission source and a substrate holder, the method comprising: emitting from the emission source a deposition material; and translating a flux barrier disposed between the emission source and the tilted substrate through a deposition flux of the deposition material according to a designated rotational translation profile designated to spatially control the deposited film thickness.

In some embodiments, the translating further comprises translating the flux barrier according to a uniform angular velocity.

In some embodiments, the translating a flux barrier comprises translating the flux barrier in accordance with a rotational axis that is parallel to the deposition flux.

In some embodiments, the method further comprises: selecting as the flux barrier, based on one or more of a deposition system geometry or a substrate geometry, a designated barrier from a plurality of respective flux barriers, each of the plurality comprising a respective barrier geometry corresponding to one or more of a designated deposition system geometry or a designated substrate geometry.

In some embodiments, the translating comprises actuating via one or more actuators translation of the flux barrier according to the designated rotational translation profile.

In some embodiments, the method further comprises selecting as the designated angular translation profile, at least in part based on one or more of a deposition system geometry, a substrate geometry, or a deposition material, a given translation profile from a plurality of designated translation profiles.

In some embodiments, the controlling of the film thickness comprises depositing a uniform film thickness on the substrate.

In accordance with another aspect, there is provided a vapour deposition system for spatially controlling a deposited film thickness on a substrate, the vapour deposition system comprising: an emission source for emitting a deposition flux in accordance with a substantially rotationally symmetric flux profile; a substrate holder configurable to position the substrate at a designated angle relative to the substantially rotationally symmetric flux profile; and a translatable shutter comprising a substantially rectangular portion disposed between the emission source and the substrate to block a corresponding subsection of the substantially rotationally symmetric flux profile, the translatable shutter operable to translate the substantially rectangular portion through the substantially rotationally symmetric flux profile according to a designated linear translation profile designated to spatially control the deposited film thickness.

In some embodiments, the substrate holder is further configurable to position the substrate at a plurality of designated angles relative to the substantially rotationally symmetric flux profile.

In some embodiments, the vapour deposition system is operable to deposit a plurality of film layers, each of the plurality of film layers deposited with the substrate positioned a respective one of the plurality of angles.

In some embodiments, the plurality of respective film layers comprises more than one deposition material.

In some embodiments, the substantially rectangular portion comprises a tapered width profile designated to block the substantially rotationally symmetric flux profile for a time proportional to a magnitude thereof upon translation therethrough.

In some embodiments, the designated linear translation profile comprises a non-uniform velocity profile.

In some embodiments, the non-uniform velocity profile corresponds to a spatially defined non-uniformity of deposition on the substrate.

In some embodiments, the linear translation profile is applied in accordance with a translation axis that is substantially perpendicular to the substantially rotationally symmetric flux profile.

In some embodiments, the translatable shutter further comprises an actuator operable to translate the substantially rectangular portion according to the designated linear translation profile.

In some embodiments, the vapour deposition system further comprises a digital data storage component having stored thereon the designated linear translation profile, the vapour deposition system further comprising a digital data processor operable to execute translation of the substantially rectangular portion via the actuator.

In some embodiments, the designated linear translation profile is designated to enhance a uniformity of the deposited film thickness.

In some embodiments, the enhanced uniformity is characterised by a non-uniformity of less than 1%.

In some embodiments, the enhanced uniformity comprises a uniformity enhancement relative to a baseline deposition layer uniformity.

In some embodiments, the designated linear translation profile is designated to enhance the uniformity in a double angle deposition process.

In accordance with another aspect, there is provided a vapour deposition system for spatially controlling a deposited film thickness on a stationary substrate, the vapour deposition system comprising: an emission source; a substrate holder; and a translatable shutter comprising a flux barrier disposed between the emission source and the substrate and operable to translate, during a deposition process, the flux barrier through a deposition flux according to a designated translation profile designated to spatially control the deposited film thickness.

In some embodiments, the substrate holder is configurable to position the stationary substrate at a designated angle relative to a deposition flux axis, and wherein the designated translation profile is designated as a function of a system geometry or a substrate geometry.

In some embodiments, the flux barrier comprises a non-uniform width profile.

In some embodiments, the non-uniform width profile corresponds to one or more of a deposition system geometry or a substrate geometry.

In some embodiments, the flux barrier comprises a plurality of barrier modules, each of the plurality comprising a respective barrier geometry corresponding to a respective deposition system geometry.

In some embodiments, the translatable shutter further comprises an actuator operable to translate the flux barrier according to the designated translation profile.

In some embodiments, the vapour deposition system further comprises a digital data storage component having stored thereon the designated translation profile, the vapour deposition system further comprising a digital data processor operable to execute translation of the flux barrier via the actuator.

In some embodiments, the designated translation profile is designated to enhance a uniformity of the deposited film thickness.

In some embodiments, the enhanced uniformity is characterised by a non-uniformity of less than 3%.

In some embodiments, the enhanced uniformity is characterised by a non-uniformity of less than 2.5%.

In some embodiments, the enhanced uniformity is characterised by a non-uniformity of less than 1%.

In some embodiments, the enhanced uniformity comprises a uniformity enhancement over a baseline deposition layer uniformity.

In some embodiments, the designated translation profile comprises a designated linear translation profile.

In some embodiments, the designated linear translation profile comprises a non-uniform velocity profile.

In some embodiments, the non-uniform velocity profile corresponds to a spatially defined non-uniformity of deposition on the stationary substrate.

In some embodiments, the linear translation profile is applied in accordance with a translation axis that is substantially perpendicular to the deposition flux.

In some embodiments, the designated translation profile comprises a designated rotational translation profile.

In some embodiments, the designated rotational translation profile comprises a uniform angular velocity.

In some embodiments, the rotational translation profile is applied in accordance with a rotational axis that is substantially parallel to the deposition flux.

In some embodiments, the emission source comprises a plurality of emission sources.

In accordance with some aspects, there is provided a method for spatially controlling a film thickness deposited on a stationary substrate using a vapour deposition system comprising an emission source and a substrate holder, the method comprising: emitting from the emission source a deposition material; and during the emitting, translating a flux barrier disposed between the emission source and the stationary substrate through a deposition flux of the deposition material according to a designated translation profile designated to spatially control the deposited film thickness.

In some embodiments, the method further comprises angling the stationary substrate at an angle relative to a deposition flux axis, and designating the designated linear translation profile according to the angle.

In some embodiments, the method further comprises: selecting as the flux barrier, based on one or more of a deposition system geometry or a substrate geometry, a designated barrier from a plurality of respective flux barriers, each of the plurality comprising a respective barrier geometry corresponding to one or more of a designated deposition system geometry or a designated substrate geometry.

In some embodiments, the translating comprises actuating via one or more actuators translation of the flux barrier according to the designated linear translation profile.

In some embodiments, the method further comprises selecting as the designated translation profile, at least in part based on one or more of a deposition system geometry, a substrate geometry, or a deposition material, a given translation profile from a plurality of designated translation profiles.

In some embodiments, the controlling of the film thickness comprises depositing a uniform film thickness on the stationary substrate.

In some embodiments, the designated translation profile comprises a designated linear translation profile.

In some embodiments, the translating further comprises translating the flux barrier according to a non-uniform velocity profile.

In some embodiments, the method further comprises calculating the non-uniform velocity profile at least in part based on a spatially dependent rate of deposition on the stationary substrate.

In some embodiments, the translating a flux barrier comprises translating the flux barrier in a translation axis direction that is perpendicular to an axis of propagation of the deposition flux.

In some embodiments, the designated translation profile comprises a designated rotational translation profile.

In some embodiments, the translating further comprises translating the flux barrier according to a uniform angular velocity.

In some embodiments, the translating a flux barrier comprises translating the flux barrier in accordance with a rotational axis that is parallel to the deposition flux.

In some embodiments, the emission source comprises a plurality of emission sources, and the method further comprises positioning said flux barrier at a designated position relative to one or more of said plurality of emission sources.

In accordance with another aspect, there is provided a method for depositing a film on a substrate using a vapour deposition system comprising an emission source and a translatable flux barrier, the method comprising calculating, based at least in part on a base thickness profile of a base film deposited in accordance with a designated deposition system configuration, a spatial deposition rate profile for the designated deposition system configuration; based at least in part on a geometry of the translatable flux barrier and the spatial deposition rate profile, calculating for the designated deposition system configuration a designated translation profile for the translatable flux barrier so to deposit the film on the substrate in accordance with a designated film thickness profile; and during a deposition process performed in accordance with the designated deposition system configuration, translating the translatable flux barrier through a flux from the emission source in accordance with the designated translation profile.

In some embodiments, a geometry of said flux barrier is such that, for a designated deposition configuration, said flux barrier is translatable through said deposition flux to completely shield the substrate from said deposition flux.

In accordance with another aspect, there is provided a vapour deposition system for spatially controlling a deposited film thickness on a substrate, the vapour deposition system comprising: an emission source; a substrate holder; and a translatable shutter comprising a flux barrier disposed between said emission source and the substrate and operable to translate said flux barrier through a deposition flux according to a designated translation designated to spatially control the deposited film thickness, wherein said substrate holder is configurable to position the substrate at a designated angle relative to a deposition flux axis, and wherein said designated translation is designated as a function of said designated angle; wherein said translatable shutter further comprises an actuator operable to translate said flux barrier according to said designated translation; and wherein the designated translation is designated to enhance a uniformity of the deposited film thickness.

Other aspects, features and/or advantages will become more apparent upon reading of the following non-restrictive description of specific embodiments thereof, given by way of example only with reference to the accompanying drawings.

BRIEF DESCRIPTION OF THE FIGURES

Several embodiments of the present disclosure will be provided, by way of examples only, with reference to the appended drawings, wherein.

Figure 1:
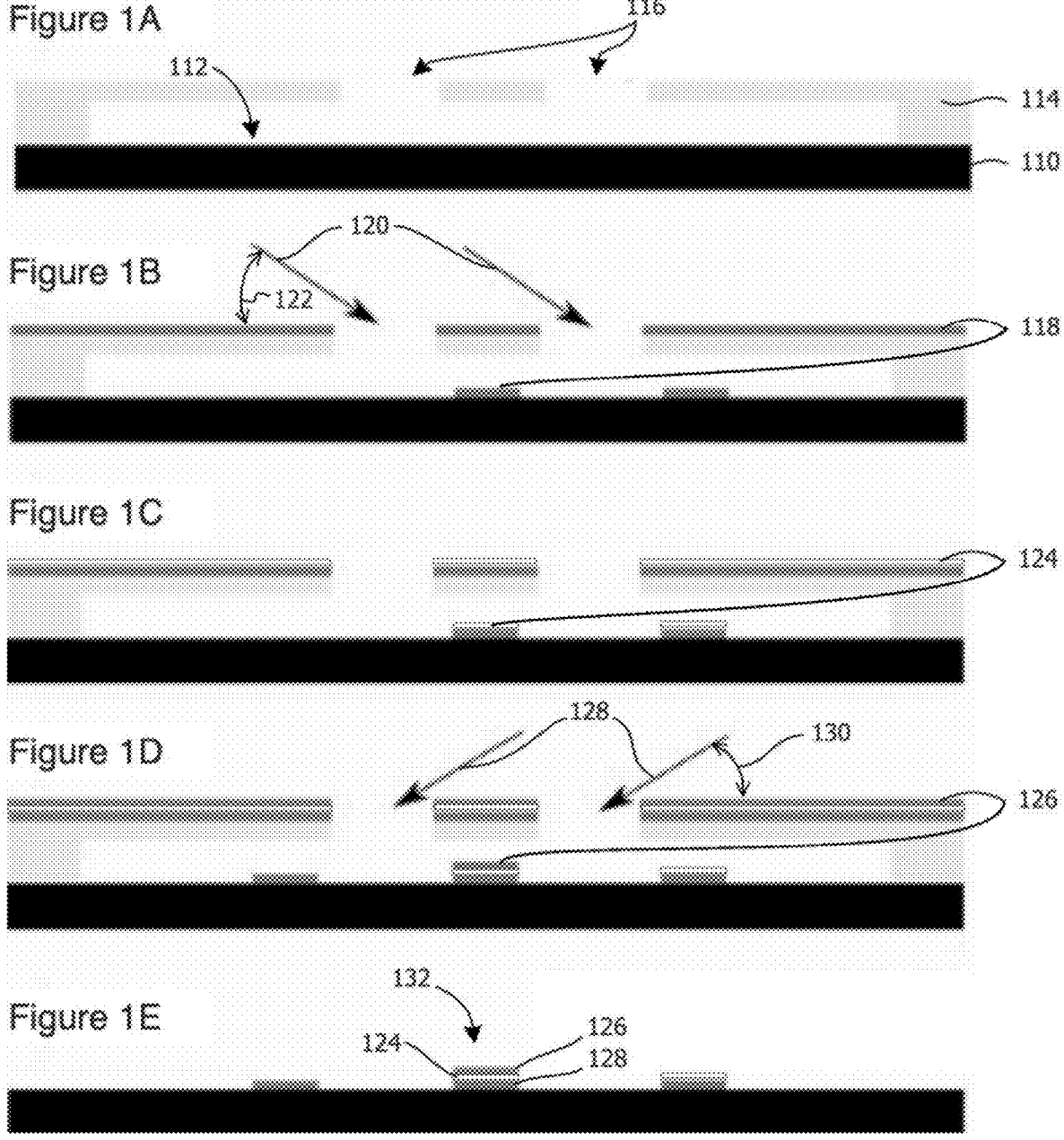
FIGS. 1A to 1E are a schematic diagrams of an illustrative double angle deposition process, in accordance with various embodiments.

Elements in the several figures are illustrated for simplicity and clarity and have not necessarily been drawn to scale. For example, the dimensions of some of the elements in the figures may be emphasized relative to other elements for facilitating understanding of the various presently disclosed embodiments. Also, common, but well-understood elements that are useful or necessary in commercially feasible embodiments are often not depicted in order to facilitate a less obstructed view of these various embodiments of the present disclosure.

DETAILED DESCRIPTION

Various implementations and aspects of the specification will be described with reference to details discussed below. The following description and drawings are illustrative of the specification and are not to be construed as limiting the specification. Numerous specific details are described to provide a thorough understanding of various implementations of the present specification. However, in certain instances, well-known or conventional details are not described in order to provide a concise discussion of implementations of the present specification.

Various apparatuses and processes will be described below to provide examples of implementations of the system disclosed herein. No implementation described below limits any claimed implementation and any claimed implementations may cover processes or apparatuses that differ from those described below. The claimed implementations are not limited to apparatuses or processes having all of the features of any one apparatus or process described below or to features common to multiple or all of the apparatuses or processes described below. It is possible that an apparatus or process described below is not an implementation of any claimed subject matter.

Furthermore, numerous specific details are set forth in order to provide a thorough understanding of the implementations described herein. However, it will be understood by those skilled in the relevant arts that the implementations described herein may be practiced without these specific details. In other instances, well-known methods, procedures and components have not been described in detail so as not to obscure the implementations described herein.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" may be construed as X only, Y only, Z only, or any combination of two or more items X, Y, and Z (e.g., XYZ, XY, YZ, ZZ, and the like). Similar logic may be applied for two or more items in any occurrence of "at least one . . . " and "one or more . . . " language.

Unless defined otherwise, all technical and scientific terms used herein have the same meaning as commonly understood by one of ordinary skill in the art to which this invention belongs.

Throughout the specification and claims, the following terms take the meanings explicitly associated herein, unless the context clearly dictates otherwise. The phrase "in one of the embodiments" or "in at least one of the various embodiments" as used herein does not necessarily refer to the same embodiment, though it may. Furthermore, the phrase "in another embodiment" or "in some embodiments" as used herein does not necessarily refer to a different embodiment, although it may. Thus, as described below, various embodiments may be readily combined, without departing from the scope or spirit of the innovations disclosed herein.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The term "comprising" as used herein will be understood to mean that the list following is non-exhaustive and may or may not include any other additional suitable items, for example one or more further feature(s), component(s) and/or element(s) as appropriate.

At present, quantum mechanical computing devices with the greatest complexity and computational power are typically designed using superconducting circuits. These circuits are well suited for quantum computing thanks to a unique superconducting circuit element called a Josephson Junction (JJ). The JJ introduces a non-linear inductance to a superconducting circuit that enables the design and operation of well-characterized two or multi-level quantum systems.

The JJ operates on the Josephson effect, which describes the flow of a supercurrent between two superconducting electrodes across a non-superconducting, or normal material. At the core of this phenomenon is the quantum tunneling of pairs of electrons, known as Cooper pairs, across the normal material. This normal material may be an insulator (a superconductor-insulator-superconductor (SIS) junction), a normal conductor (a superconductor-normal-superconductor (SNS) junction), or a coupling through a weakened superconductor bridge (a SS'S junction). For example, the Josephson effect can be observed by operating a circuit composed of a junction of two aluminum superconductor layers separated by an aluminum oxide insulator less than 30 angstroms thick.

In order to fabricate superconducting circuits, thin, very high purity layers of superconducting material (e.g. aluminum or molybdenum) are typically deposited on a substrate, which is typically a silicon wafer. In order to attain such high purities and avoid unwanted oxide or impurity incorporation, layers are often deposited by physical vapor deposition (PVD), typically from evaporative sources, such as resistive or electron beam evaporation in a high or ultra-high vacuum environment. Consequently, the terms flux, vapor flux, evaporative flux, and physical vapor deposition flux are typically used interchangeably to describe the flux of material travelling from the source to the substrate.

When fabricating superconducting circuits with JJ elements, a common approach is the double angle evaporation technique, schematically illustrated in FIG. 1, and in accordance with various embodiments. First, a substrate 110 is loaded into a vacuum chamber on a substrate holder (not shown) capable of tilting. On the front surface 112 generally facing an evaporative source, the substrate 110 has, in a suspended resist mask 114 or like structure, lithographically defined features 116, whereby the resist and its features 116 are not in direct contact with the front surface 112 of the underlying substrate 110 at the area of eventual junction formation. In accordance with various embodiments, a substrate may further be bare, or contain previously deposited materials. For instance, a substrate may comprise previously fabricated features for superconducting circuits, such as aluminum traces, capacitors, inductors, or the like.

A first layer 118 of a superconducting material is deposited 120 (e.g. 500 Å of aluminum) at an angle 122 (e.g. 35 degrees), as shown in FIG. 1B. A cleaning step with an argon ion source prior to deposition may often be conducted to clean the substrate surface of unwanted contaminants, such as resist residue, native oxide, adsorbed water, or other surface contaminants. The deposited film 118 is oxidized, as schematically represented in FIG. 1C, in a controlled manner via the introduction of oxygen gas into the chamber at a specific pressure (e.g. 10 Torr), duration (e.g. 10 min), and temperature. The thickness of the oxide layer 124 is controlled, at least in part, by these parameters. Further, as shown in FIG. 1D, a second layer 126 of superconducting material is deposited 128 (e.g. 700 Å of aluminum) at an opposing angle 130 (e.g. −35 degrees). In areas where a JJ is to be formed, the second aluminum layer 126 deposited at the opposing angle 130 will overlap the first superconducting material layer 118 (and the oxide layer 124 thereon) deposited at the first angle 122. This forms the SIS junction 132.

Double angle evaporation is commonly a preferred method of fabricating JJs because a single masking layer may be used, allowing an entire JJ to be fabricated without removing a substrate from a vacuum chamber. This may be desirable, as the cleanliness of the surface between superconducting layers, and the purity of superconducting materials, may critically impact the performance of superconductors and the JJ.

Figure 2:
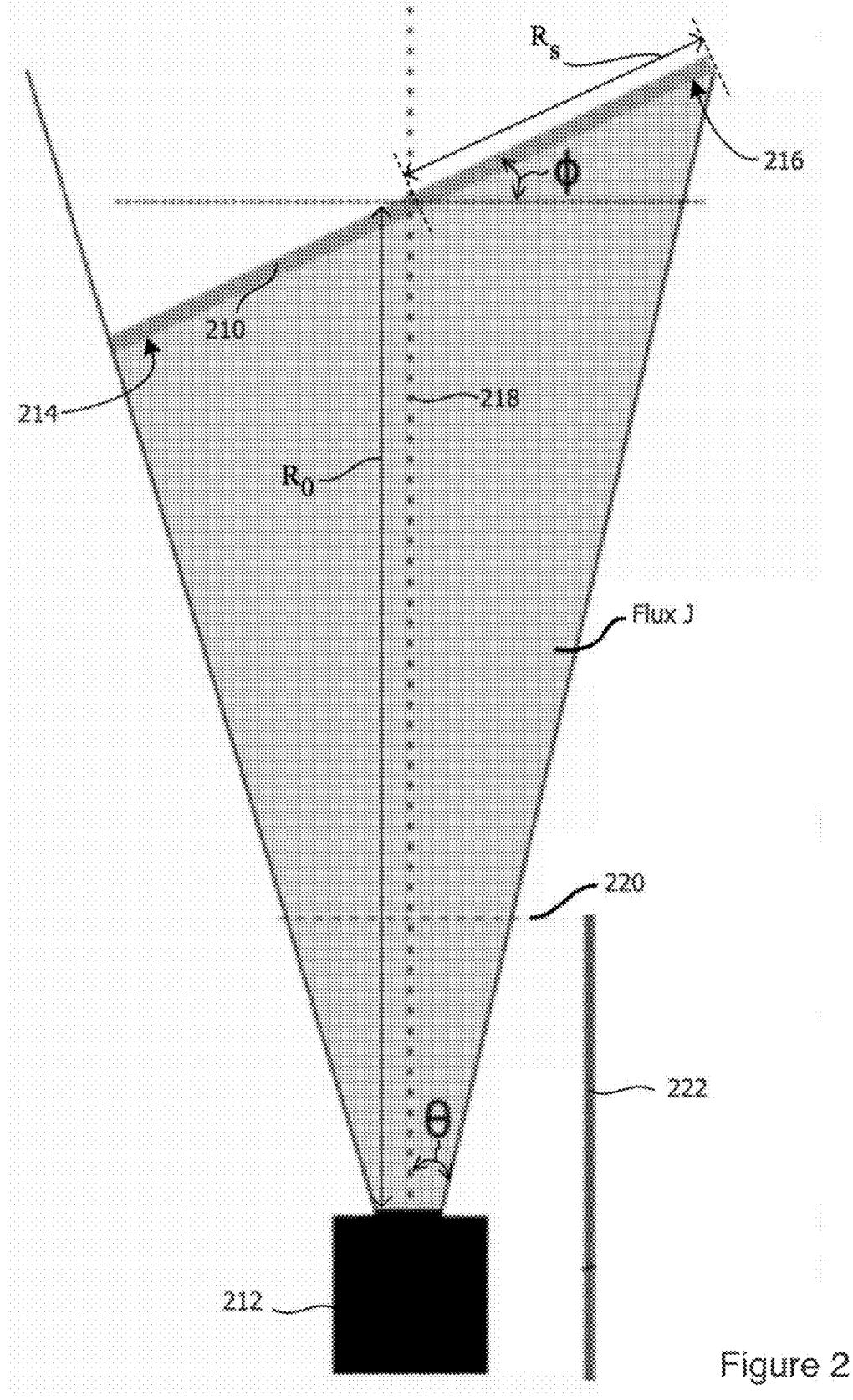
FIG. 2 is a schematic diagram of an illustrative system configuration for depositing a film on a tilted substrate, in accordance with various embodiments.

However, the double angle evaporation technique may result in the formation of a film of non-uniform thickness across the substrate. This non-uniformity may be geometric in nature, whereby one portion of the substrate 210 will be tilted closer to the evaporative source 212, while another part will be tilted further away, as schematically illustrated in FIG. 2. This may result in a greater evaporative deposition rate on or near an edge 214 of the substrate 210 that is closer to an evaporative source 212, and a lesser deposition rate on an edge 216 of the substrate further away. As a result, superconducting layer thicknesses may vary across the wafer.

The evaporative flux arriving on the surface of a flat substrate from a resistive or electron beam heated physical vapor deposition source, such as source 212 in FIG. 2, can be approximated, in accordance with some embodiments, as:

$$J = \frac{Q \cos^n \theta}{\pi R^2} \qquad \text{(Equation 1)}$$

where Q is the total evaporation rate into the hemisphere from a disc-shaped source. θ is the angle from normal 218, as shown in FIG. 2, defined as $$\theta = \tan^{-1}\left(\frac{R_s}{R_0}\right),$$

where R is generally the distance between the source and any point on the substrate surface, $R_s$ is defined as the radius of the substrate and $R_0$ is defined as the source-to-substrate throw distance, or the distance between the centre of the source 212 to the (tilt axis of the substrate 210. The degree to which the evaporative flux is collimated may be described by the exponent n, whereby an electron beam evaporation source may comprise a range of n values (e.g. between 1.8 and 2). A flat substrate with extended dimension will, by nature of geometry, have a thickness variation that will vary as a function of $\cos^n \theta$ and $1/R^2$, with the effect more pronounced for, for instance, large diameter substrates, and/or those that are close to the source.

A tilted substrate will have an additional thickness variation from edge to edge that is dominated by the change in throw distance from one edge of the substrate to the other:

$$J_{Max} = \frac{Q \cos^n \theta \cos(\phi + \theta)}{\pi (R_0 - R_s \sin \phi)^2} \quad \text{(Equation 2A)}$$

$$J_{Min} = \frac{Q \cos^n \theta \cos(\phi - \theta)}{\pi (R_0 + R_s \sin \phi)^2} \quad \text{(Equation 2B)}$$

where $\phi$ is the substrate tilt angle. By greatly increasing the source-to-substrate distance, $R_0$, the thickness variation across a tilted substrate can be reduced, but not eliminated, and at the expense of the deposition rate falling proportional to $1/R_0^2$. Similarly, the substrate diameter can be reduced at the expense of decreased useful device processing area. The term $\cos(\phi-\theta)$ corrects for the non-normal incidence of evaporative flux on the tilted substrate surface.

The configuration illustrated in FIG. 2 depicts a source-substrate arrangement where the source 212 is centered beneath the substrate 210. In this example, the throw distance $R_0$ does not change as the substrate 210 is tilted with increasing or decreasing $\Phi$, and thus may serve as a useful parameter to calculate how the throw distance will change for points on the substrate off of center (i.e. with $\theta$) or due to tilt (i.e. with $\Phi$). However, in some embodiments, the source and substrate may be arranged in an off-centred manner, such that the centre of the source 212 is not directly beneath the centre of the substrate 210. In such configurations, tilting by the same magnitude in the positive and negative may yield different effective deposition angles, while deposition on a "flat" wafer (i.e. $\Phi=0$) would effectively have the substrate at an angle to the deposition source. This may accentuate the $\cos^n(\theta)$ term, while reducing uniformity and deposition rates. However, in such embodiments, $R_0$ may still be defined as the distance between the centres of the source and the $\Phi$ tilt axis substrate, although it would not be normal to the source or the substrate surface at $\Phi=0$.

The problem of film thickness uniformity during double angle evaporation is typically accommodated in two ways. In some cases, it is accepted that the usable substrate area is low. This may be the result of restricting a substrate to smaller diameters to limit the magnitude of the non-uniformity across the substrate, or by tiling small, identical, stand-alone "chips" across a large diameter substrate with the knowledge that some may perform better than others. In some environments, such as in research laboratories, this may be preferred if the fabrication parameter space is not well known or understood, and varying the superconducting film thickness across several chips within each deposition improves the likelihood of discovering high performing chips.

In other cases, such as when substrate-wide uniformity is preferred, it is common to increase the throw distance between the evaporative source and the target. However, this can not only not eliminate the non-uniformity caused by tilting, but this can severely impact deposition rates and material utilisation efficiency.

Without correction, a large difference in film layer thickness may occur across the wafer when depositing at an angle. For example, for a 150 mm diameter wafer deposited on with a throw distance of 782 mm at an angle of 30 degrees, a non-uniformity of greater than ±18% may be observed, where non-uniformity is defined as the (thickest measurement–thinnest measurement) divided by (2*average thickness).

Figure 3A:
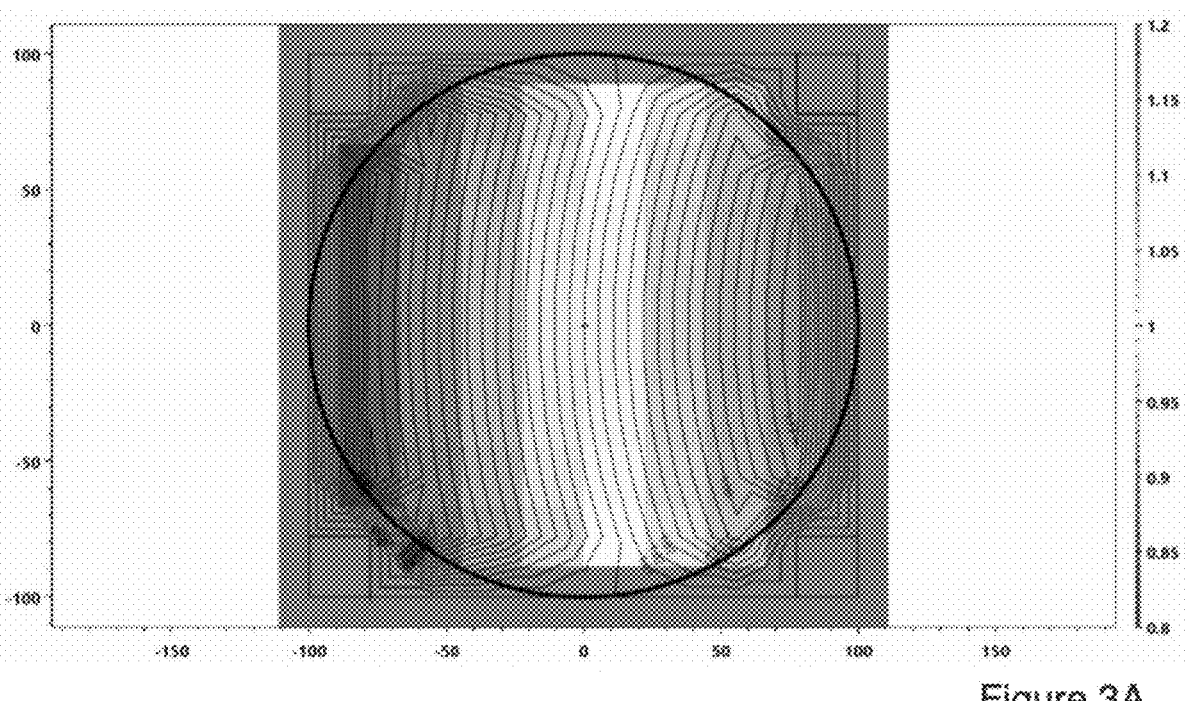
FIGS. 3A to 3D are illustrative plots of simulated film thicknesses deposited on tilted substrates using various simulation parameters, in accordance with various embodiments.
Figure 3B:
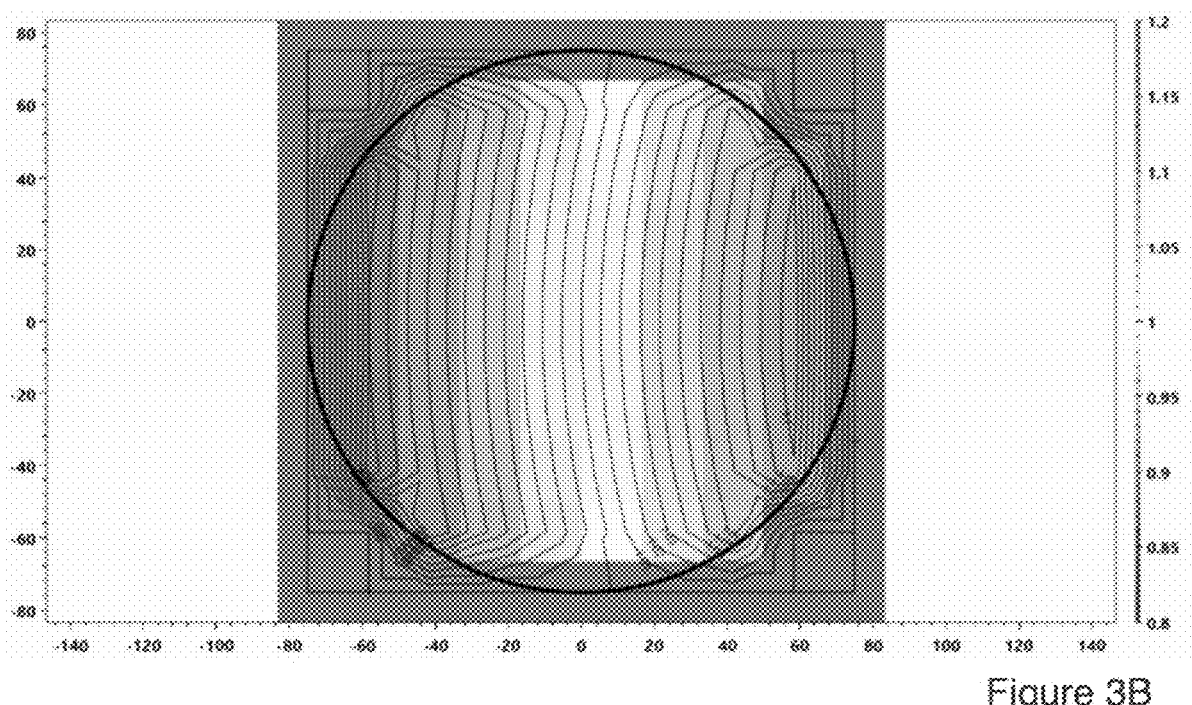
Figure 3C:
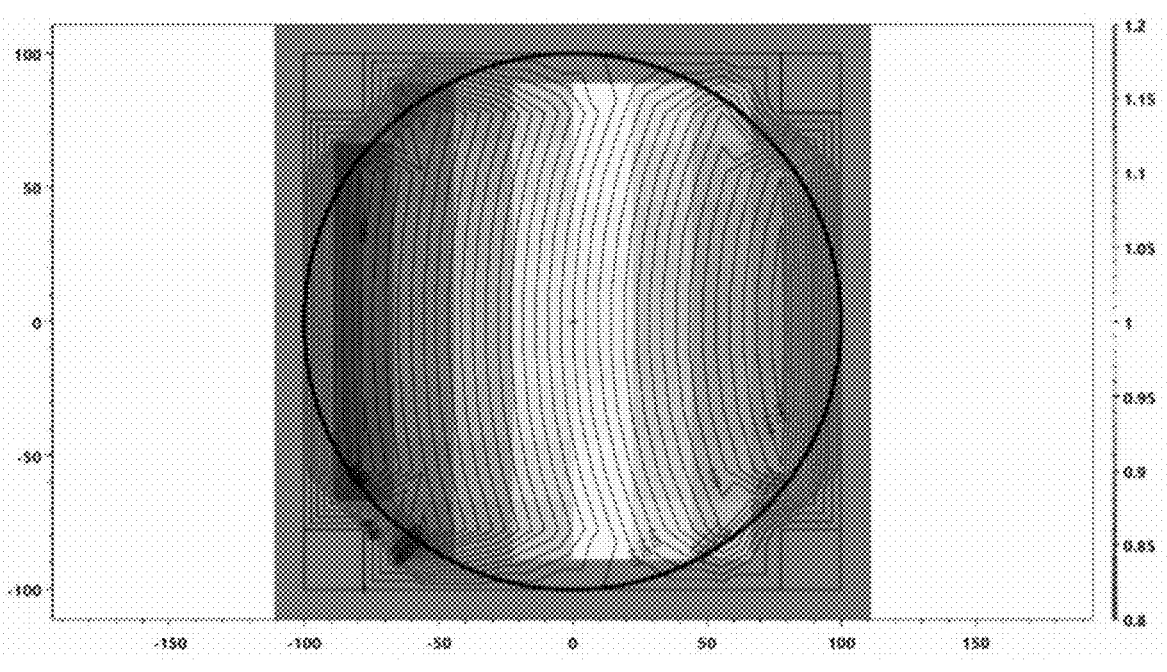
Figure 3D:
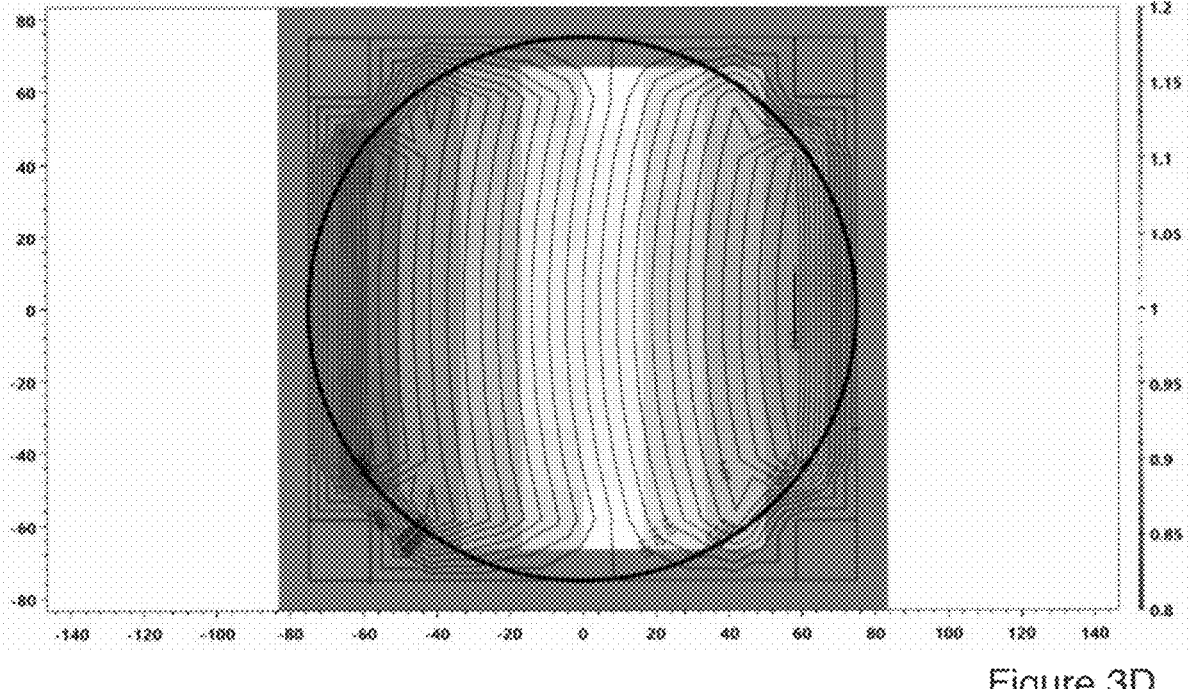

This behavior may be modelled using, for instance, commercially available software. FIGS. 3A to 3D shows plots of thicknesses for a substrate tilted at 30 degrees using various modeling conditions as simulated using UniformityPro™. FIG. 3A shows the calculated thickness variation for a substrate size of 200 mm and a throw distance of 800 mm, with a resulting uniformity of 14.70%. FIG. 3B shows the calculated thickness variation for a substrate size of 150 mm and a throw distance of 800 mm, with a resulting uniformity of ±11.06%. FIG. 3C shows the calculated thickness variation for a substrate size of 200 mm and a throw distance of 700 mm, with a resulting uniformity of ±16.74%. FIG. 3D shows the calculated thickness variation for a substrate size of 150 mm and a throw distance of 700 mm, with a resulting uniformity of ±12.63%.

A change in superconductor layer thickness may lead to differences in circuit performance from one chip to another on the same substrate, hindering repeatability and the scaling of quantum computing chip production. In some cases, for instance when fabricating very thin layers, the superconducting film may have a detrimentally low critical superconducting current value, or even fail to superconduct. Superconducting circuits and the JJs thereof are typically required to be highly stable and repeatable in their effect on the quantum states they contribute to producing and controlling. Enabling even basic quantum computing may rely on thousands of JJs functioning in this manner.

A significant body of work exists with regards to understanding and correcting thin film uniformity on flat substrates without tilt, spherical substrates, conical substrates, dome shaped fixtures, and planetary fixtures. Each of these unique geometries present respective challenges and benefits for achieving uniform film thicknesses across a substrate. Many of these arrangements may hold a substrate at a tilted angle to the vapor deposition source, but uniformity is typically achieved through sample rotation around one or more axes throughout the deposition process. In some cases, a stationary shutter may be used in conjunction with rotation of a sample to improve uniformity. However, it is not possible to rotate a substrate during, for instance, a double angle evaporation, as each deposition must occur at a specific angle; substrate movement would cause an undesirable change in lithographic feature size and shape.

The systems and methods described herein provide, in accordance with different embodiments, different examples in which a deposition rate may be controlled across different regions of a substrate. Various embodiments relate to systems and methods enabling a control over a deposited film thickness using a dynamically adjustable plate or like structure, also hereinafter referred to as a "uniformity shutter", that may be actuable to translate spatially to dynamically block flux in a deposition system. In accordance with various embodiments, a uniformity shutter may provide improvement of uniformity of a film thickness across a substrate in, for instance, double angle deposition applications, and/or may mitigate, improve, or eliminate challenges associated with non-uniform film thickness for flat and/or titled substrates, and generally enable spatial control over deposition rate to control film thickness across or around a wafer.

Various examples herein described relate to a PVD system or evaporative deposition system comprising a substrate or sample holder and an evaporative source configured to emit material in a conical flux profile having a directionality substantially aligned along an axis intercepting the substrate. However, various other deposition systems and/or geometries are further considered within the scope of the disclosure. For instance, examples may include, but are not limited to, off-axis deposition systems, systems comprising a plurality of deposition sources, sources configured to emit material in various flux profiles and/or at various angles relative to an axis of symmetry of the system, or the like. Furthermore, embodiments herein contemplated are not limited to specific materials (e.g. aluminum, oxides, and the like) or applications (e.g. quantum computing components, JJs, and the like). Rather, embodiments herein described may further be applied in deposition systems operable to provide films of various deposition materials (e.g. aluminum, niobium, lead, titanium, indium, vanadium, tantalum, gold, silver, copper, molybdenum, etc.), compound materials (e.g. NbTi, Nb$_3$Sn, or the like), or number thereof for various other applications (e.g. uniform PVD deposition of glancing angle deposition (GLAD) nanostructures without continuous substrate rotation). Further, while various embodiments relate to the provision of films with improved uniformity (i.e. reduced non-uniformity), the systems and methods herein disclosed may provide controlled non-uniformity in, for instance, applications in which a designated thickness variation across a substrate or substrates is preferred or required. Accordingly, while various examples herein described relate to reducing a non-uniformity of a deposited film, it will be understood that the opposite effect, or other effects related to control over a deposition rate on various regions of a substrate, may be desirable, and in accordance with various embodiments.

A uniformity shutter, in accordance with various embodiments, may be moved (e.g. translated) across or through a cross section of flux J in a deposition system between an evaporative source 212 and a substrate 210 along a designated path, such as the path 220 of FIG. 2, and/or in accordance with a designated translation profile. A uniformity shutter may, in accordance with some embodiments, further move across a flux J, for instance from one edge of the flux J to the other, in accordance with a designated velocity profile. A velocity profile may, in accordance with various embodiments in which a substrate 210 is tilted with respect to a normal 218, be adjusted to reduce the thickness of a film deposited on an edge 214 of a wafer 210 tilted towards the source 212 by, for instance, moving more slowly through a corresponding edge or portion of the evaporative flux J. Conversely, a velocity profile may be adjusted to increase the thickness of the film deposited on the edge 216 of the wafer 210 tilted away from the source 212 by moving more quickly through the corresponding edge of the flux. On the other hand, in applications in which a larger thickness variation is required across a substrate than would naturally be provided by a tilted geometry, a uniformity shutter may pass more slowly across an edge 214 closer to a source 212, while passing more quickly across an edge 216 further from the source 212, so to, for instance, emphasise a natural non-uniformity of deposition resulting from a particular system geometry. In yet other embodiments, an arbitrary thickness profile may be provided across a substrate by blocking a measured or predicted amount of flux (e.g. blocking a region of flux for a designated amount of time) corresponding to a desired film thickness at a corresponding location on a substrate.

A uniformity shutter, in accordance with various embodiments, may assume various shapes and/or take many different possible paths to control a film uniformity, or to provide control over a deposition rate at various regions of a substrate. For example, with reference to FIG. 4 and in accordance with various embodiments, a uniformity shutter 410 may comprise a thin, rectangular section 412. The uniformity shutter may be linearly actuated, for instance along path 414, through a cross section of the vapor flux 416. In this example, the path 414 may correspond to, for instance, the path 220 of FIG. 2. The velocity profile of the uniformity shutter 410, for instance along path 414, may be such that it moves more slowly (or quickly) when blocking material that would otherwise be depositing on a region of a substrate or wafer that is tilted towards (or away from) a vapor deposition source or emission source. In order to, for instance, improve uniformity of a deposited film, the frequency of the shutter 410 moving through an evaporative flux 416 (coming out of the page in FIG. 4) during depositing of a layer may, in some embodiments, be an integer number of passes (e.g. 1, 3, or 8 passes), or many (e.g. greater than 10) full passes, although various embodiments relate to any number of full and/or partial passes. During motion, such translation along the path 414, a uniformity shutter may comprise a leading edge depending on a direction of motion. For instance, edge 418 comprises the leading edge of the shutter 410 when the direction of motion is from left to right in FIG. 4, while edge 420 is the leading edge when the direction of motion is from right to left.

Based on the amount of vapor flux 416 blocked by a shutter 410 that would otherwise arrive at corresponding regions of the substrate, the deposition and/or deposition rate may be controlled across a substrate. For instance, flux 416 arriving at a substrate may be more significantly reduced by a uniformity shutter disposed within the flux near an edge of a substrate or wafer that is closest to an evaporative source compared to when the uniformity shutter is disposed within the flux so to block deposition on an edge region of the wafer furthest from the evaporative source. Control over the duration of time that a uniformity shutter blocks different flux regions therefore enables an improvement of a film uniformity for a tilted sample. By adjusting the uniformity profile, a linearly actuated uniformity shutter may accommodate, for instance, a wafer tilted in either direction normal to a path 414, or to accommodate any other tilt angles relative to any geometrical plane for various other applications. For example, various embodiments herein described relate to a substrate tilt angle ranging from 0 degrees to 90 degrees.

Figures 5A, 5B, 5C:
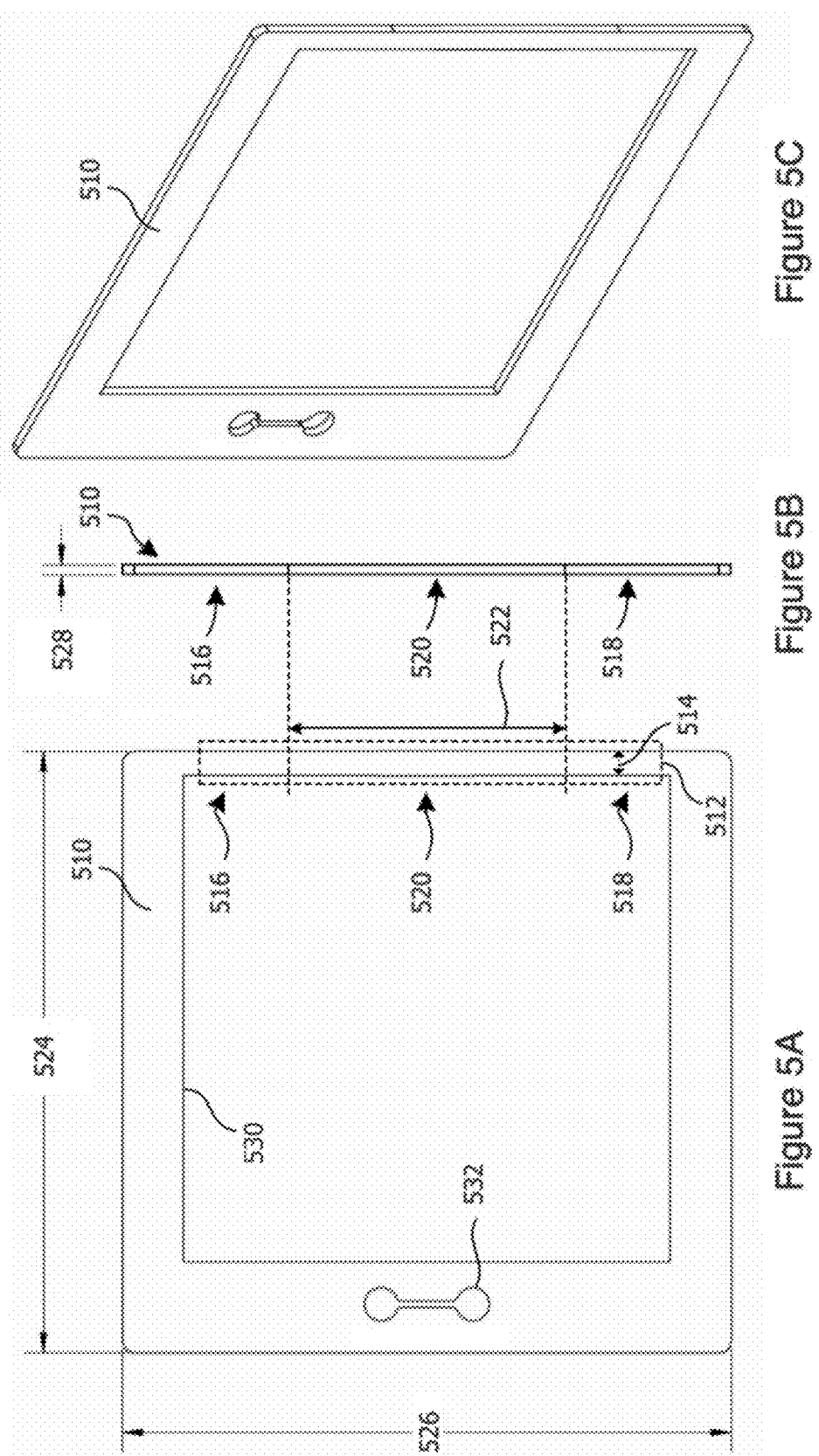
FIGS. 5A to 5C are schematic diagrams showing top plan, side and perspective views, respectively, of a linearly actuated uniformity shutter.

With reference now to FIGS. 5A to 5C showing different top, side and perspective views, respectively, of a uniformity shutter 510, and in accordance with at least one embodiment, a uniformity shutter 510 may comprise an active region 512 (i.e. a region of the shutter system 510 that blocks flux during deposition), which in turn comprises a variable width 514. For instance, the active region 512 may, in accordance with some embodiments, comprise end regions 516 and 518 that are thinner than a middle portion 520. In some embodiments, a middle region 520 may have a designated length 522 over which the width 514 is variable. In other embodiments, the width 514 may be continuously variable over the length of the active region 512. In some embodiments, the active region 512 may comprise a tapering width 514, wherein width 514 continually increases towards a centre of a middle region 520. The presence of the taper may compensate for, for instance, a $\cos^n \theta$ and $1/R^2$ variation in thickness across a substrate, such as a variation related to the flux non-uniformity described by Equation 1.

The degree of variation of width 514 may correspond to, for instance, the throw distance $R_0$. For large values of $R_0$, the $\cos^n \theta$ and $1/R^2$ variation in thickness across a substrate may be minor (e.g. leading to 1% non-uniformity across a 150 mm wafer at a throw distance of 844 mm). That is, and in accordance with various embodiments, the change in deposition rate at different ends of a substrate arising from a substrate tilt angle $\phi$ due to $1/R^2$ variations may be more dominant relative to a $\cos^n \theta$ variation in thickness across a substrate when a substrate has a high degree of tilt. In such geometries, the variation in width 514 may therefore be relatively small (e.g. a maximum variation comprising a fraction of a millimetre, as schematically represented in FIG. 5A). For geometries in which a substrate is perpendicular or close thereto to a flux (i.e. small tilt angles), and/or where non-uniformity of film thickness is more dominated by, for instance, a $\cos^n \theta$ variation than by effects arising from a substrate tilt angle, variation in width 514 may be more pronounced, in accordance with various embodiments.

Figure 5D:
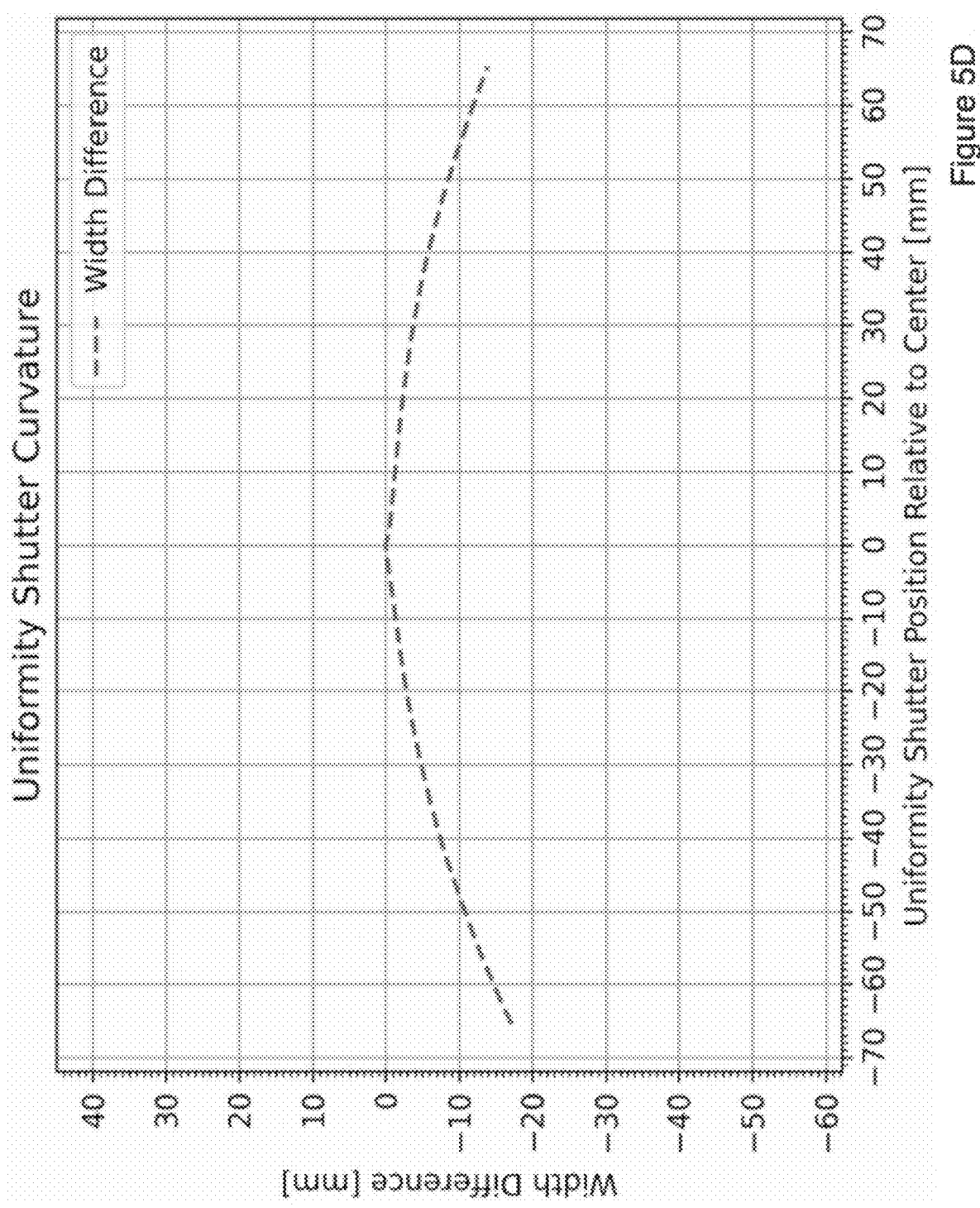
FIG. 5D is an illustrative plot of an exemplary width profile of an exemplary uniformity shutter.

FIGS. 5A to 5C schematically illustrate a uniformity shutter 510 that may, in accordance with various embodiments, be actuated to translate across the face or a surface of a substrate in a linear fashion (i.e. following a linear path of motion). Various embodiments relate to the shutter 510 comprising various lengths 524, widths 526, and thicknesses 528, which may be designated to accommodate, for instance, a particular deposition application, system geometry, substrate size, and/or substrate tilt angle. For example, and in accordance with one embodiment, FIG. 5D is an illustrative plot of representing an exemplary width profile for a uniformity shutter. In this example, the difference in width from a maximum shutter width is plotted as a function of the uniformity shutter position relative to the centre of the uniformity shutter. As described above, such a width profile may be beneficial to, for instance, account for the thickness non-uniformity that occurs when depositing on a substrate of finite width (described by Equation 1), thereby providing a desired or improved uniformity of a deposited layer. However, it will be further appreciated that a width profile such as that of FIG. 5D may be designed, calculated, or selected based on other system or substrate properties. Moreover, while FIG. 5D shows an exemplary width profile over the length of an exemplary uniformity shutter, it will be appreciated that one or both 'edges' of a uniformity shutter may be characterised by a curvature. For example, depending on the application at hand, a uniformity shutter may comprise a flat trailing edge, and a curved leading edge (e.g. having a curvature directly reflecting the width profile of FIG. 5D). In accordance with other embodiments, both edges of a uniformity shutter may comprise curvature, for instance to correct non-tilt axis non-uniformity when a shutter translates both forwards and backwards (i.e. comprises two leading edges). In accordance with different embodiments, the curvature of each edge of such shutter may be the same (i.e. both edges characterised by the same curvature), or different (i.e. the shutter may comprise asymmetric edges).

It will be appreciated that the width profile of FIG. 5D is presented for illustrative purposes, and that other uniformity shutter profiles may be designed or employed, in accordance with different embodiments. That is, various embodiments relate to various shutter profiles depending on, for instance, a system geometry (e.g. a deposition chamber geometry), the distribution of material evaporating from a source, or the like, depending on the application at hand. Furthermore, a uniformity shutter shape may depend on the velocity (or velocity profile) employed during deposition. While the selection of a translation profile (e.g. an optimal velocity profile) may limit, for instance, a degree of non-uniformity correction that may be applied in a non-tilt axis direction, the systems and methods herein described may nevertheless provide improvements over conventional deposition processes and systems.

Returning again to FIGS. 5A to 5C, a shutter 510 and/or active region 512 may comprise one or more constituent materials comprising a property that renders the shutter partially or completely impermeable to one or more deposition materials, or fluxes related thereto. A shutter 510 may further be fabricated by various means, non-limiting examples of which may include, laser cutting, machining, 3D printing, or other conventional means known in the art, and may therefore comprise a material suitable to the fabrication means compatible with deposition conditions, such as metals, ceramics, or some plastics.

For instance, one embodiment, as illustrated in FIGS. 5A to 5C, relates to a shutter 510 that is laser cut from a material comprising a thickness 528 of ~1.6 mm (i.e. ~0.063 inches, or one sixteenth of an inch), a length 524 of ~100 mm, and a width 526 of ~100 mm. In this example, a hole 530 is cut in the material to provide a region through which flux may pass to deposit material on a substrate behind the shutter 510 when in operation, while defining the active region 512 for dynamically blocking flux at designated locations and/or at designated rates according to a translation or velocity profile. In accordance with some embodiments, and as shown in FIGS. 5A, a shutter 510 may comprise other features, such as hole 532. In accordance with some embodiments, such features 532 may, for instance, be configured to accommodate an actuator or portion thereof operable to translate the shutter 510 according to a designated translation and/or velocity profile.

The skilled artisan will further appreciate that various geometries, including various geometries related to the shutter 510, active region 512, hole 530, dimensions 524, 526, or 528, or the like, may be selected based on a particular application or geometry without departing from the general scope and nature of the disclosure. Furthermore, while the shutter system 510 comprises portions in excess of the active region 512, various embodiments relate to various other configurations comprising only an active region 512, or only select excess regions or body portions of the uniformity shutter 510 shown in FIGS. 5A and 5C, any of which may be coupled at any one or more locations to an actuator or other means known in the art operable to translate the shutter 510 or active region 512 according to a translation or velocity profile.

Figure 4:
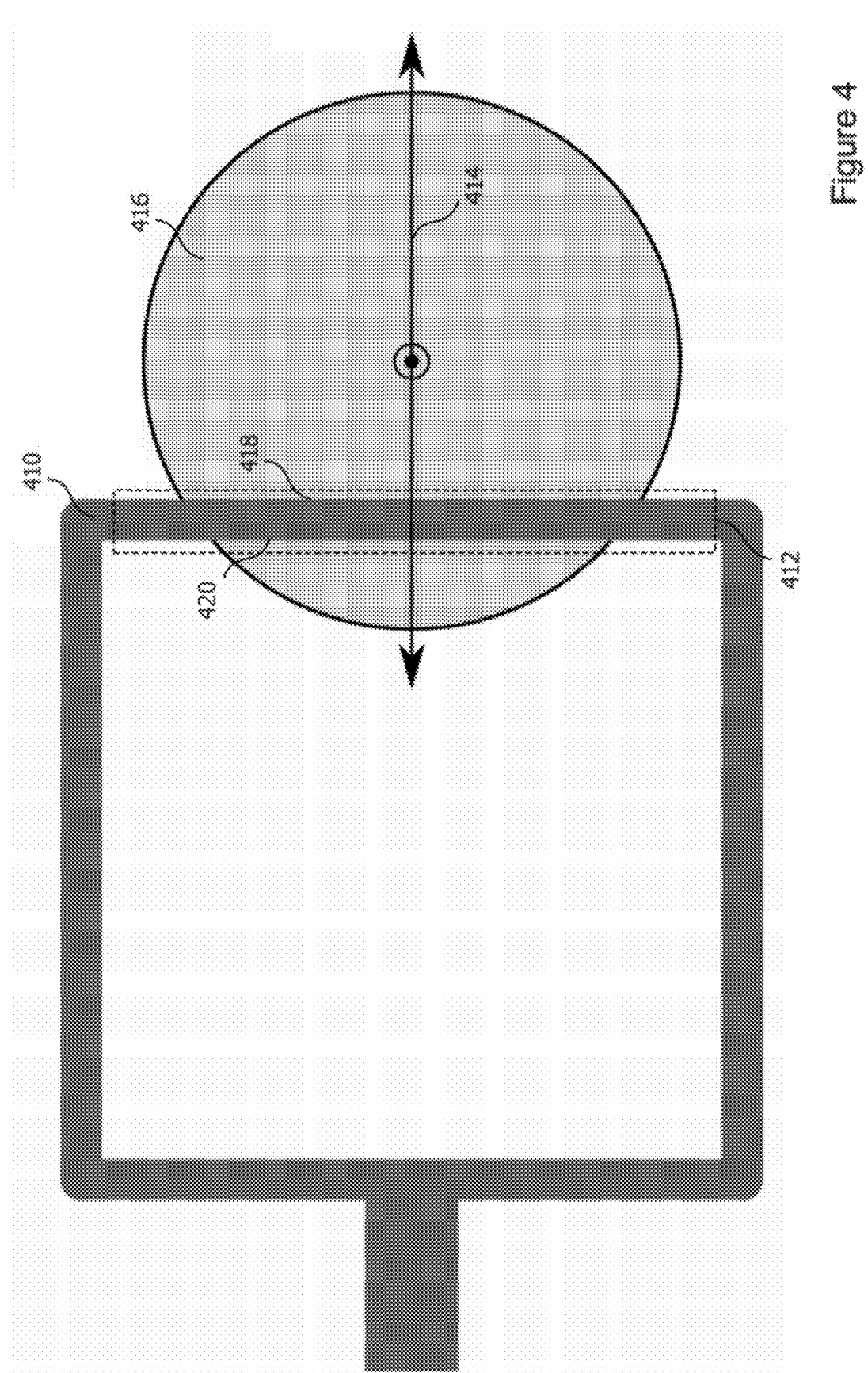
FIG. 4 is a schematic diagram of a linearly actuated uniformity shutter, in accordance with various embodiments.
Figure 5E:
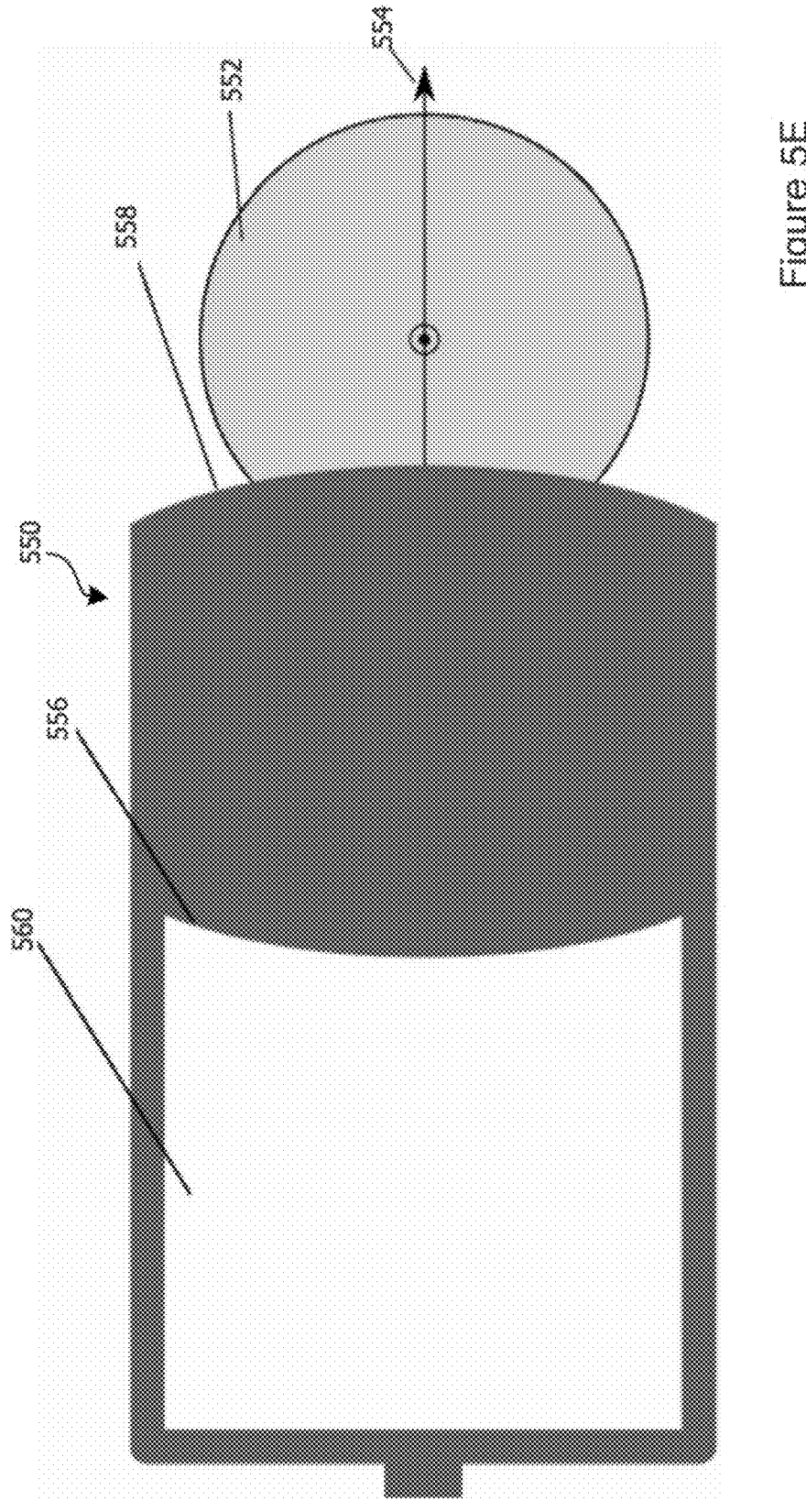
FIGS. 5E to 5G are schematic diagrams of exemplary uniformity shutters having a wide shutter geometry, in accordance with various embodiments.
Figures 5F, 5G:
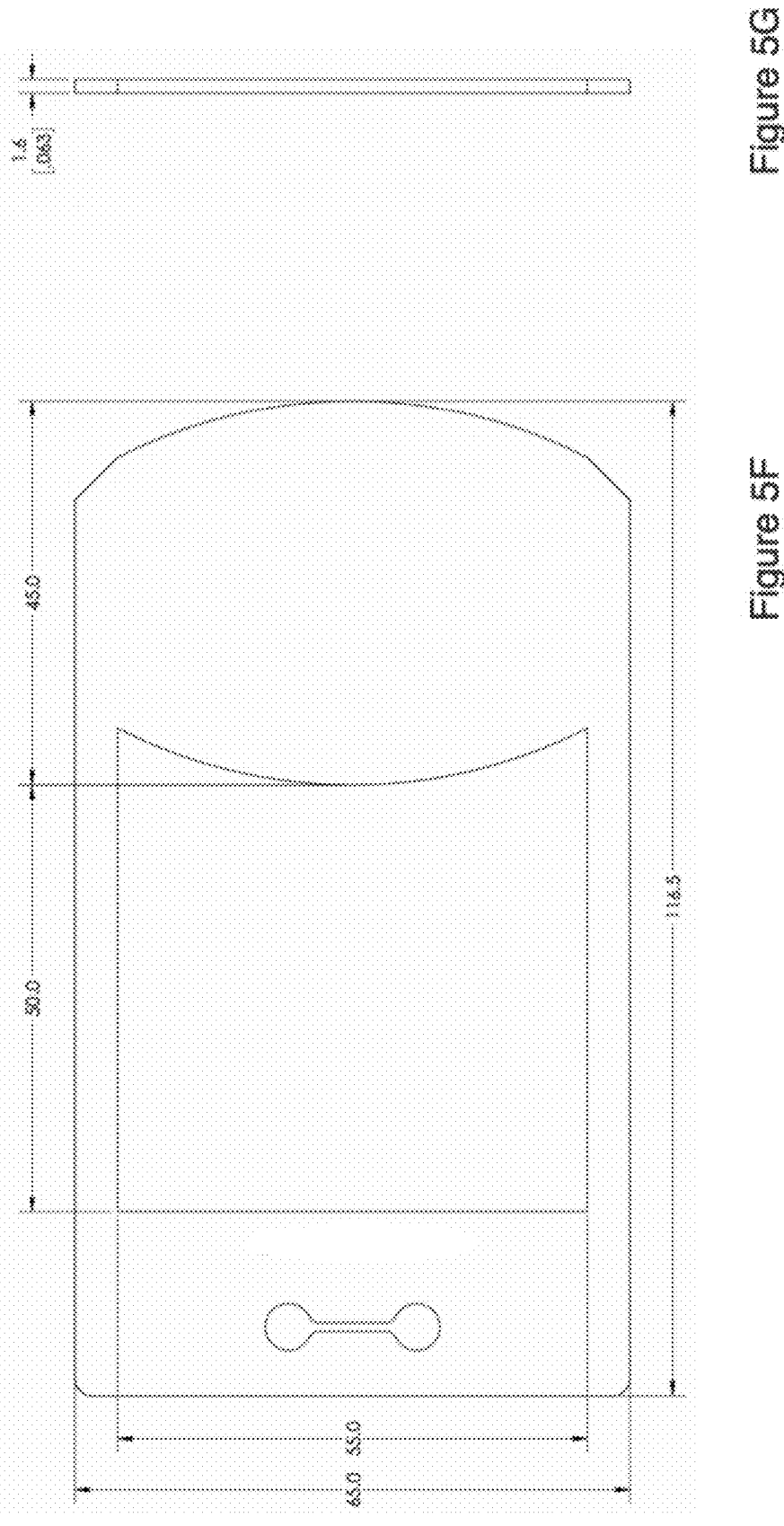

In accordance with various embodiments, FIGS. 5E to 5G are schematics of alternative dynamic shutter configurations comprising a 'wide' shutter geometry. That is, while the dynamic shutters described above with respect to, for instance, FIG. 4, comprise a geometry or width that is smaller than the width of a deposition vapour plume (also herein referred to as a 'narrow' shutter), the exemplary shutters of FIGS. 5E to 5G comprise a geometry that is at least as wide or as large as a vapour plume at the height at which the shutter will pass therethrough during operation. This aspect is schematically shown in FIG. 5E, wherein the 'wide' dynamic shutter 550 is sufficiently large to completely block a vapour plume 552 during translation 554. That is, the shutter region between the inner edge 556 and the other edge 558 comprises a width profile that is greater than that of the vapour plume 552 in the plane of shutter translation, and can therefore completely shield a substrate from the plume upon translation 554. Accordingly, while this exemplary shutter 550 comprises an opening 560 to define the inner edge 556, and therefore allow for uniformity correction for both positive and negative tilt angles, various embodiments relate to deposition processes or systems in which a substrate may not necessarily be re-exposed upon shutter translation 554.

That is, while translation 414 of the 'narrow' shutter 410 of FIG. 4 through the vapour plume 416 will result in re-exposure of substrate regions upon passage of the shutter 410, some embodiments related to the wide shutter 550 of FIG. 5E may relate to the deposition of layers in accordance with a single exposure period. For example, the shutter width between outer and inner edges 558 and 556 is sufficient to completely block the plume 552 and/or shield the substrate upon translation 554 of the shutter 550 through vapour plume 552, without resulting in re-exposure of substrate regions through the shutter opening 560. Such a 'wide' shutter may, in accordance with some embodiments, simplify or facilitate a deposition process by, for instance, simplifying a uniformity shutter translation or velocity profile calculation, and/or by improving a uniformity of a resultant deposited layer. For instance, a uniformity shutter having a geometry (e.g. a two-dimensional shape, such as a width and/or curvature) characterised in that it may shield the entirety of a substrate from a vapour plume (i.e. not 're-expose' a substrate to a deposition flux upon translation of a distance greater than the width of the shutter) may enable the calculation of simplified translation and/or velocity profiles. This may, in some embodiments, enable the deposition of a designated layer thickness and/or uniformity with, for instance, a single 'pass' of the shutter during a deposition process. Accordingly, and in accordance with some embodiments, a wide shutter may be preferred for some system configurations. In accordance with one embodiment, FIGS. 5F and 5G show top plan and side views, respectively, of an exemplary design of one such wide uniformity shutter, wherein the noted dimensions have units of millimetres.

It will be appreciated that uniformity shutter configurations may be selected based on the application at hand. For instance, while a wide geometry may be preferred for large systems (e.g. large deposition chambers), various embodiments relate to the calculation of a translation profile for a uniformity shutter that is narrower than a vapour plume (i.e. a 'narrow' shutter), wherein re-exposure of the substrate to the vapour plume is accounted for in profile calculations. For example, a 'narrow' uniformity shutter may be characterised by a width that is between one half and the full width of the vapour plume, and may be preferred for systems or applications in which it would be challenging or impossible to, for instance, accommodate a wide shutter in a deposition chamber.

In some embodiments, a narrow or wide shutter may be shaped to comprise respective leading and trailing edge profiles. For example, a wide shutter design may include a curved or convex leading edge to promote a substantially improved deposition uniformity, while including a straight or rectangular trailing edge given an intended unidirectionality of the shutter. For example, such a wide shutter design may be used in a single pass configuration whereby the leading-edge shape is selected to promote greater deposition uniformity in a single pass, and whereby the shutter's translation terminates at a point in which the entire substrate is shielded from the deposition flux such that the trailing edge does not ultimately impact the deposition quality.

In other wide shutter designs, a tailing edge may be formed to act as an opposed leading edge in a multi-pass deposition process, or again, to accommodate single pass depositions in different shutter translation directions. Such processes may benefit from identical or respective distinct leading and opposed leading edge shapes, for example, to address relative positive and/or negative tilts given shutter directionality, and/or other such deposition configurations and/or geometries. Accordingly, the shutter can have a different leading edge for each direction and that leading edge can be optimized independently of the other, allowing the shutter to be optimized for two distinct processes, for example. Furthermore, distinct leading edge and opposed leading edge designs may be applied to narrow shutter designs, again, for multi-pass deposition processes or the like.

In accordance with various embodiments, a translation or velocity profile associated with motion of a uniformity shutter may be designated based on a theoretical or inferred film thickness profile, system configuration, or the like. For instance, an evaporative flux in a deposition system having a particular system geometry may be appropriately represented by, for instance, Equations 1, 2A, and 2B. A uniformity shutter may therefore, in some embodiments, be dynamically actuated or translated according to a velocity profile that corresponds to a theoretical flux profile across a substrate. For example, a velocity profile may comprise a mathematical transformation of a known deposition rate or flux profile such as those described by Equations 1, 2A, and 2B.

In accordance with some embodiments, a substrate region presumed to be subjected to a high degree of flux according to, for instance, Equations 2A and 2B, may relate to a shutter translation velocity that is slower through a corresponding region of flux (i.e. the shutter will travel more slowly, and therefore block more flux, when traveling through a region of high flux than when traveling through a region of lower flux). In accordance with various embodiments, various other theoretical or inferred values may be employed to determine an appropriate velocity profile. For instance, simulated values of flux, deposition rates, or the like, such as those presented in FIG. 3, may be employed or transformed to determine a velocity profile.

Figure 6A:
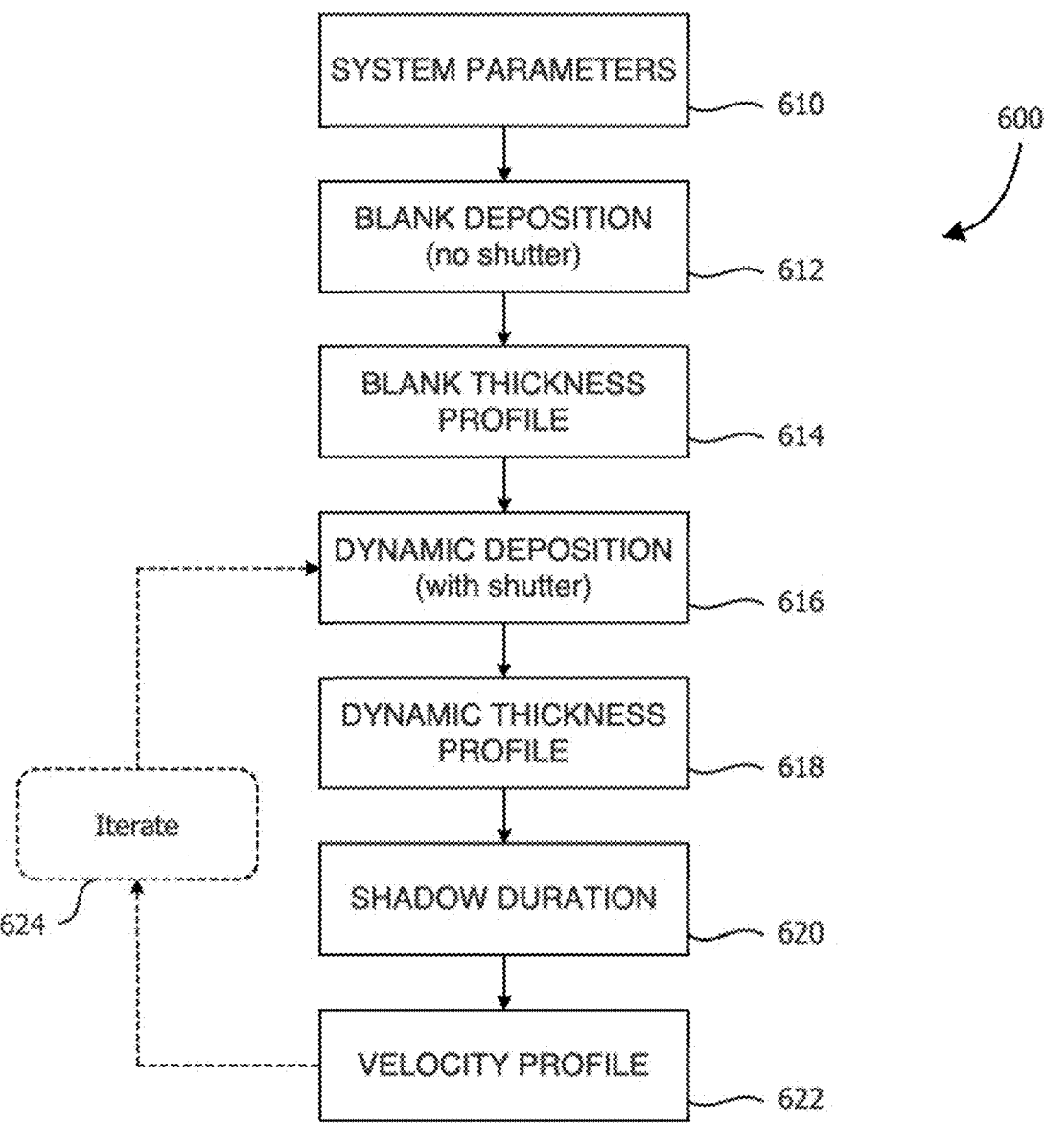
FIGS. 6A and 6B are diagrams of exemplary processes for calculating a uniformity shutter velocity profile.

In other embodiments, a translation or velocity profile may be empirically determined for a particular system geometry, deposition material, or the like. Such embodiments may relate to a velocity profile that will allow a particular uniformity shutter geometry to produce, for instance, a uniform film on a tilted substrate, wherein the velocity profile may be determined by an empirical process of measuring the effective deposition rate at points across a tilted substrate. FIG. 6A shows one exemplary embodiment for empirically determining a uniformity shutter velocity profile via a calibration process, generally referred to with the numeral 600.

In this example, the process may begin by determining, inputting, or receiving preferred or desired system parameters 610 corresponding to a particular experimental condition. For instance, system parameters 610 may comprise a substrate tilt angle, a deposition material, a $R_0$ distance, a uniformity shutter geometry, a preferred flux profile, a deposition system geometry, sputtering conditions, or the like. Such parameters may, in accordance with various embodiments, be received by a digital application operable to perform subsequent calibration steps, received by a technician performing a calibration process, input by a user for automatic system calibration or velocity profile determination, or the like.

A blank deposition 612 may be performed, in the absence of a uniformity shutter, on a substrate tilted at an angle of interest, or according to one or more other system parameters 610. The resultant film thickness profile 614 (or deposition rate as a function of position) corresponding to the particular system parameters 610 employed may then be determined or measured by a means known in the art, either within the deposition system, or upon removing the substrate from the system. In one embodiment, the deposition rate as a function of position across the substrate may be determined by measuring the thickness profile 614 across the substrate, and dividing by the time that the substrate was exposed to the deposition source. In some embodiments, a measurement of how the effective deposition rate varied from an edge that was tilted closest to the source to the edge that was tilted furthest away from the source may be employed to determine a thickness profile 614. In some embodiments, a deposition system may further comprise a thin film thickness monitor disposed therein. For example, a quartz crystal thickness sensor may monitor a deposited film thickness in real time. The sensor may be placed in the vacuum chamber with direct line-of-sight to the deposition source and/or substrate, but does not block flux travelling to the substrate. In embodiments having a thickness sensor facing the source, a measured or calculated deposition rate may be different from that arriving at the substrate; however, this difference may be corrected for using a tooling factor or other means to determine a deposition rate on the substrate by, for instance, experimental calibration.

In another process step, which the skilled artisan will appreciate may be performed either before or after a blank deposition step 612, the influence of the uniformity shutter on deposition properties may be determined with a dynamic deposition step 616. In this step, a deposition may be performed with a uniformity shutter moving through the vapor flux at a known velocity. The resultant thickness profile 618, or deposition rate profile as a function of position across the substrate, may be measured or otherwise inferred. With prior knowledge of the effective deposition rate 614 during deposition 612 without the shutter, a difference between the thickness profiles 618 and 614 (or deposition rates related thereto) may yield the spatial effectiveness of the shutter. In some embodiments, the effectiveness of the shutter may comprise a shadow duration 620 at various positions across the substrate. A shadow duration 620, in accordance with various embodiments, may be unique for a particular system geometry or system parameter set 610, and/or the known velocity at which the shutter was moving.

A velocity profile 622 may then be calculated or inferred based on the effective shadow duration 620, or difference in thickness profiles 618 and 614 for corresponding points along the path of travel of the uniformity shutter. The velocity profile 622 may then be employed, for instance, to spatially control the amount of material that may arrive at the substrate. For instance, if it is preferred, based on thickness profiles 614 and 618, to block twice as much material at a particular substrate location, the velocity profile 622 may comprise a velocity at that location that is halved. Conversely, if it is desired to block half as much material at a particular location of the substrate, the velocity may be doubled during movement through a corresponding location along the translation path. Accordingly, the preferred shadow duration 620, and thus the uniformity shutter velocity according to velocity profile 622, may be computed that is required to make, for instance, a uniformly thick film across the substrate.

Such empirical calibration of systems may, in accordance with some embodiments, be preferred over other embodiments in which velocity profiles may be performed automatically and/or based on theoretical or assumed system properties. For instance, in practice, deviation from assumed properties or error in the measurement of deposition time and thickness may lead to errors in calculated effective deposition rates. Similarly, effective deposition rates and shadow durations may deviate between calibrations, or upon changing a system configuration or deposition material. Accordingly, while a first velocity calibration or determination, such as that described in FIG. 6A, may improve uniformity, additional improvements may, in accordance with various embodiments, be subsequently performed. For instance, and in accordance with various embodiments, a shadow duration (and thus velocity profile) may be iteratively adjusted at process step 624 of FIG. 6A, following one or more exposures and thickness measurements to produce, for instance, highly uniform films (i.e. a velocity profile may be iteratively improved, by, for instance, repeating some or all process steps of FIG. 6A). Accordingly, some embodiments further relate to calculating a first velocity profile 622. A film may then be deposited while employing the calculated velocity profile in a second iteration of dynamic deposition 616, and a corresponding thickness profile 618 determined. Resulting thickness data may then be used to modify a calculated velocity profile 622 to account for, for instance, a measured non-uniformity. Such iteration 624 may be repeated as necessary to achieve a desired precision or accuracy related to, for instance, a film uniformity. For example, and in accordance with at least one embodiment, a non-uniformity may be iteratively addressed by depositing a film according to a given velocity profile, modifying the velocity profile in proportion to a measured non-uniformity, and repeating as necessary.

Various embodiments further relate to tuning, in conjunction with the use of a uniformity shutter, one or more source emission properties (e.g. an electron-beam evaporation of a source), a non-limiting example of which may comprise a source or flux uniformity, to improve a film thickness property and/or uniformity. Such tuning or improvement may, for instance, be performed iteratively during a calibration process, a non-limiting example of which is depicted in FIG. 6A.

Figure 6B:
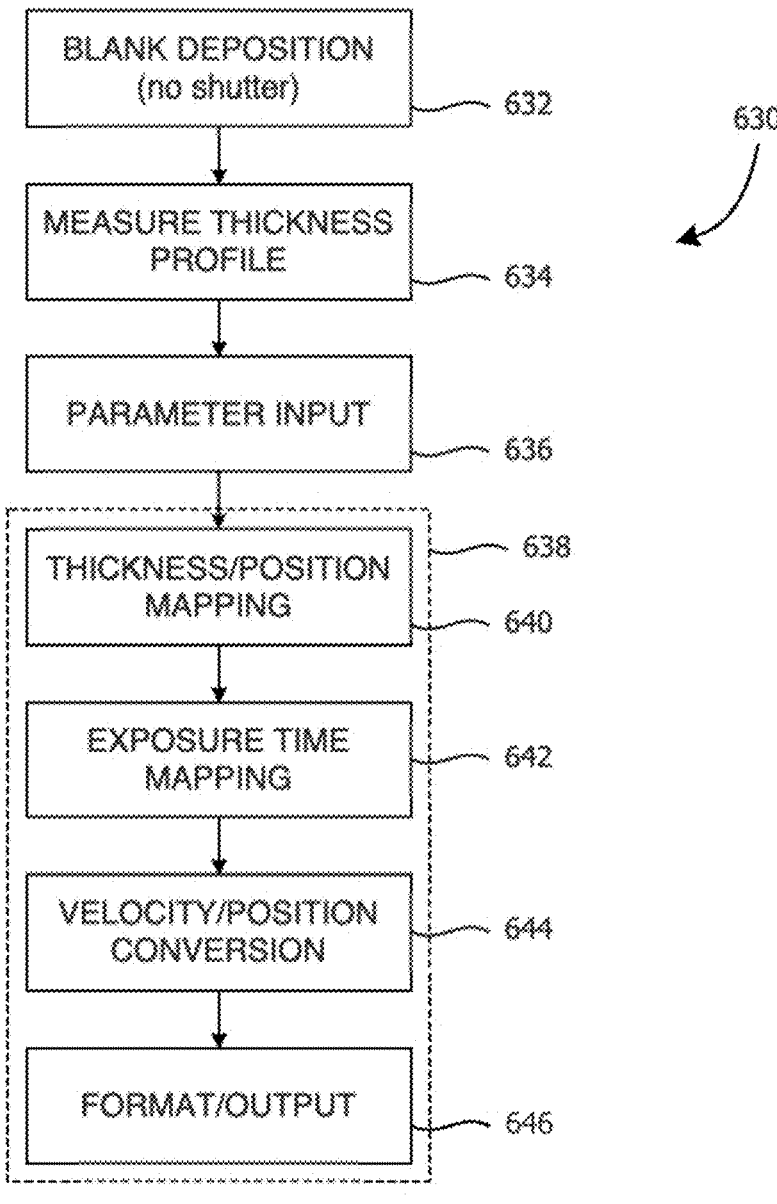

In accordance with another embodiment, FIG. 6B is a diagram illustrating another exemplary process 630 for calculating a uniformity shutter velocity profile that may be employed during a layer deposition process. In this example, the process 630 comprises a blank (or 'base') deposition step 632 performed in the absence of a uniformity shutter, in accordance with a designated deposition system configuration (e.g. with the substrate disposed at the desired tilt angle). The resultant layer may be simultaneously or subsequently measured 634 (e.g. along the tilt axis) to determine a thickness profile of the layer, which may in turn be used to determine various deposition properties (e.g. a deposition rate as a function of substrate position). It will be appreciated that such a base deposition 632 may be performed on a base substrate, which may comprise, for instance, a sacrificial substrate, or the substrate on which subsequent depositions may be performed.

The process 630 further comprises receipt of various parameters as input 636 by a computer program to perform various calculations. For example, in accordance with one embodiment, a computer program may receive as input 636 parameters related to deposition rate (e.g. the rate as calculated from the measured thickness 634 from the blank deposition 632), a target layer thickness, the tilt angle of the substrate, a substrate diameter (e.g. the maximum substrate diameter), a width of the uniformity shutter to be employed (or a profile thereof, such as the width profile in the plot of FIG. 5D), a source-to-substrate distance, a source-to-uniformity shutter distance, a source diameter, a geometric coefficient, such as a correction factor representing the width of the source that is evaporating material, which may be small (e.g. 10%) or large (e.g. >100%), or the like.

The computer program may then perform calculations 638 to determine a uniformity shutter translation or velocity profile for a deposition process. For instance, and in accordance with various embodiments, the process 630 may comprise mapping 640 deposition thickness and position data from the substrate to the plane of the uniformity shutter based on input parameters 636. It will be appreciated that this may involve the additional calculation of various parameters, including normalised deposition parameters (e.g. deposition thickness normalised by the thinnest region of a deposited layer), the diameter of the vapour plume at the position of the uniformity shutter, uniformity shutter start and end points, or the like. This may, among other aspects, allow for the determination of whether a uniformity shutter is sufficiently 'wide' to completely block a vapour plume at the shutter height. Such a 'wide' shutter may, in accordance with some embodiments, simplify or facilitate a deposition process by, for instance, simplifying a uniformity shutter translation or velocity profile calculation, and/or by improving a uniformity of a resultant deposited layer, as described above. However, various embodiments may alternatively relate to the calculation of a translation profile for a uniformity shutter that is narrower than a vapour plume (i.e. a 'narrow' shutter), wherein re-exposure of the substrate to the vapour plume is accounted for in profile calculations.

The process 630 may further comprise exposure time mapping 642. In accordance with some embodiments, this may comprise calculating the amount of time each point or region of the substrate is to be exposed to a vapour plume to achieve a target thickness. This may in turn relate, in some embodiments, to the amount of time after deposition begins before which the shutter is required to block deposition for each position. For example, FIG. 6C is an exemplary plot showing a calculated position of a 'wide' uniformity shutter (i.e. a shutter of equal or greater width than the vapour plume at the height, or in the plane, of the uniformity shutter) as a function of time since the initiation of a deposition.

In accordance with various embodiments, such plots may yield or be approximated by a plurality of functions, or a piecewise function. For instance, in the exemplary embodiment of FIG. 6C, the calculation of a profile corresponding to shutter position as a function of time for a wide shutter may be approximated by two second order polynomial functions. In this example, the two polynomials are fit to the position profile of FIG. 6C for respective regions of the substrate on either side of the substrate tilt axis at position=0 mm. In accordance with various embodiments, such analytical functions may serve as input parameters for subsequent calculations, or be directly formatted for and executed by an actuator (e.g. a servo motor) to translate a uniformity shutter.

Figure 6C:
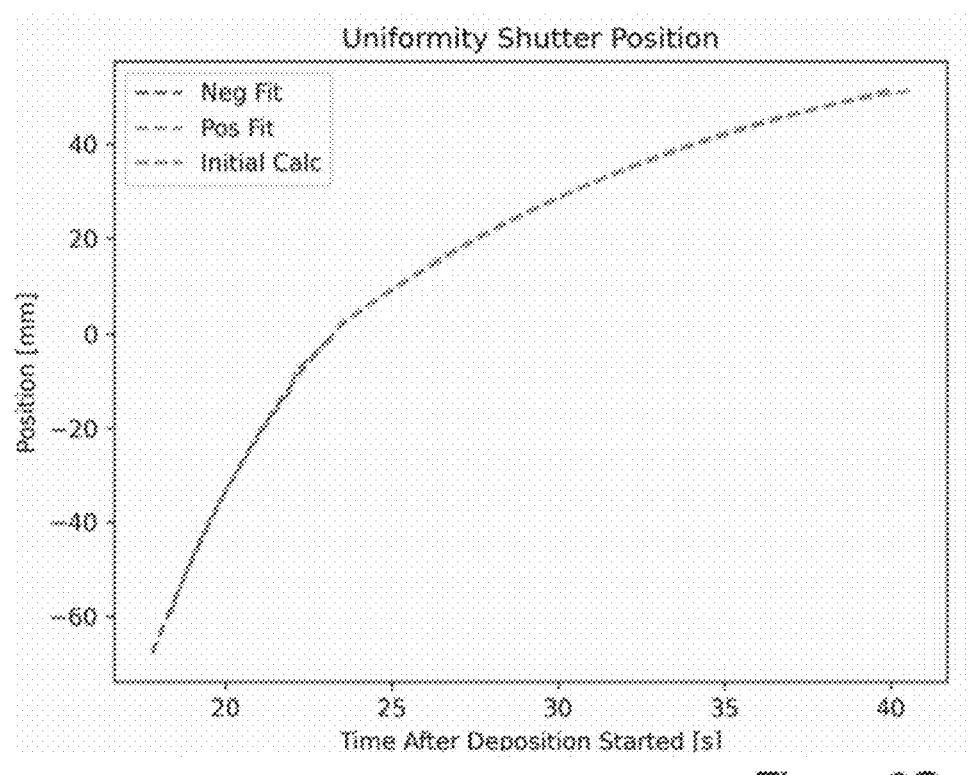
FIGS. 6C to 6F are illustrative plots of exemplary uniformity shutter translation regimes calculated in accordance with the exemplary process of FIG. 6B, in accordance with various embodiments.
Figure 6D:
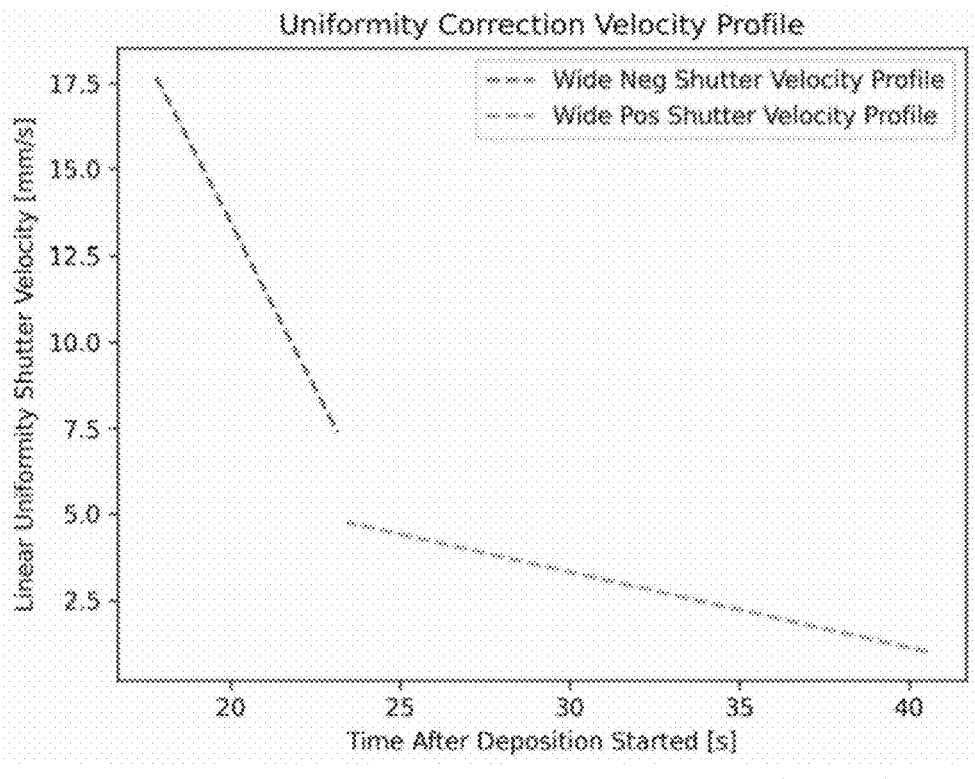
Figure 6E:
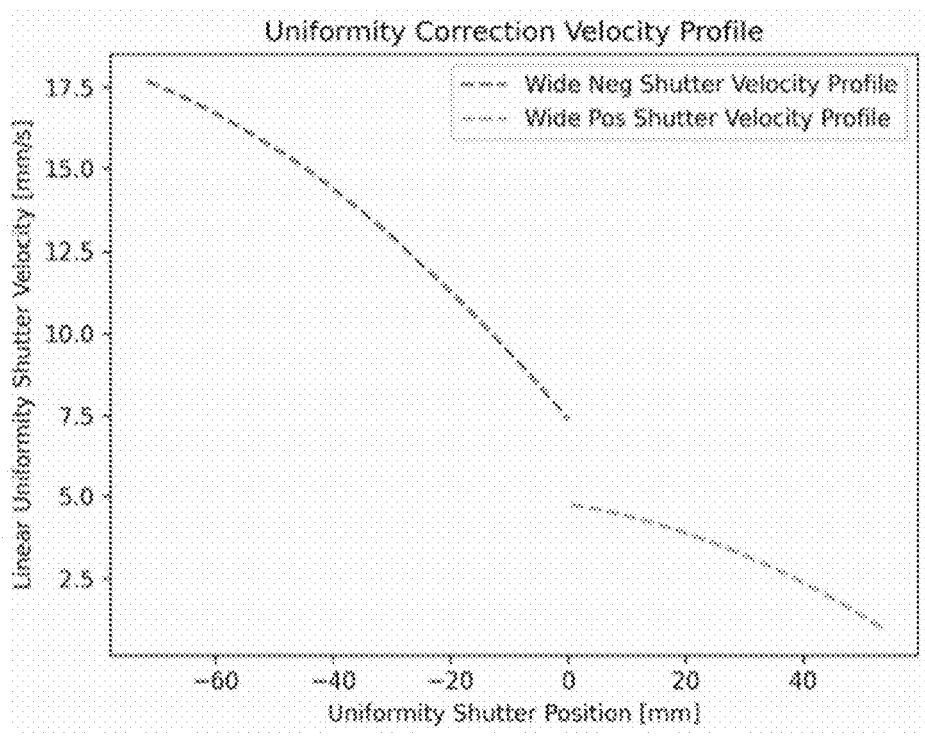

In the embodiment of FIGS. 6C to 6E, deposition begins with the uniformity shutter disposed on the side of the substrate that is tilted towards (closer to) the deposition source, and deposition is performed in accordance with unidirectional shutter movement in the 'positive' direction (as labeled in FIG. 4C), ending after approximately 40 s. However, it will be appreciated that various embodiments relate to shutter translation in the 'negative' direction to correct non-uniformity for a substrate tilted in the opposite direction.

Furthermore, while some embodiments may employ a set initial deposition time before commencing translation of the shutter to promote greater deposition uniformity, other embodiments may instead rely on a deposition thickness reading. For example, in some embodiments, the deposition may proceed with the uniformity shutter located outside the evaporation plume. The linear uniformity shutter may then begin to move with a calculated velocity profile to begin shadowing the "thick" edge of the substrate, triggered by a deposition rate sensor (e.g. Quartz Crystal Microbalance—QCM) measuring a specific accumulated thickness instead of being based on deposition time, which assumes an average deposition rate is maintained during the first unshielded phase. In some circumstances, triggering the shutter based on accumulated thickness may allow for higher deposition rate instabilities and provide for better total thickness uniformity repeatability run-to-run. Other deposition timing, sequencing and shutter activation techniques may also be applied, without departing from the general scope and nature of the present disclosure.

In accordance with some embodiments, exposure time mapping calculations 642 (i.e. positional data) may optionally be translated, converted, or related with a shutter velocity profile 644 (e.g. converted into a velocity and position relationship). For instance, and in accordance with one embodiment, FIG. 6D is an exemplary plot of shutter velocity as a function of time calculated from the positional data of FIG. 6C. It will be appreciated that, in accordance with some embodiments, such data may be presented or output 646 in different forms. For example, FIG. 6E is an exemplary plot of the data of FIGS. 6C and 6D presented as a calculated shutter velocity as a function of uniformity shutter position. In accordance with various embodiments, such velocity data may be appropriately formatted similarly and output 646 for execution by an actuator (e.g. a servo motor) to translate a uniformity shutter in accordance with the calculated velocity profile.

Figure 6F:
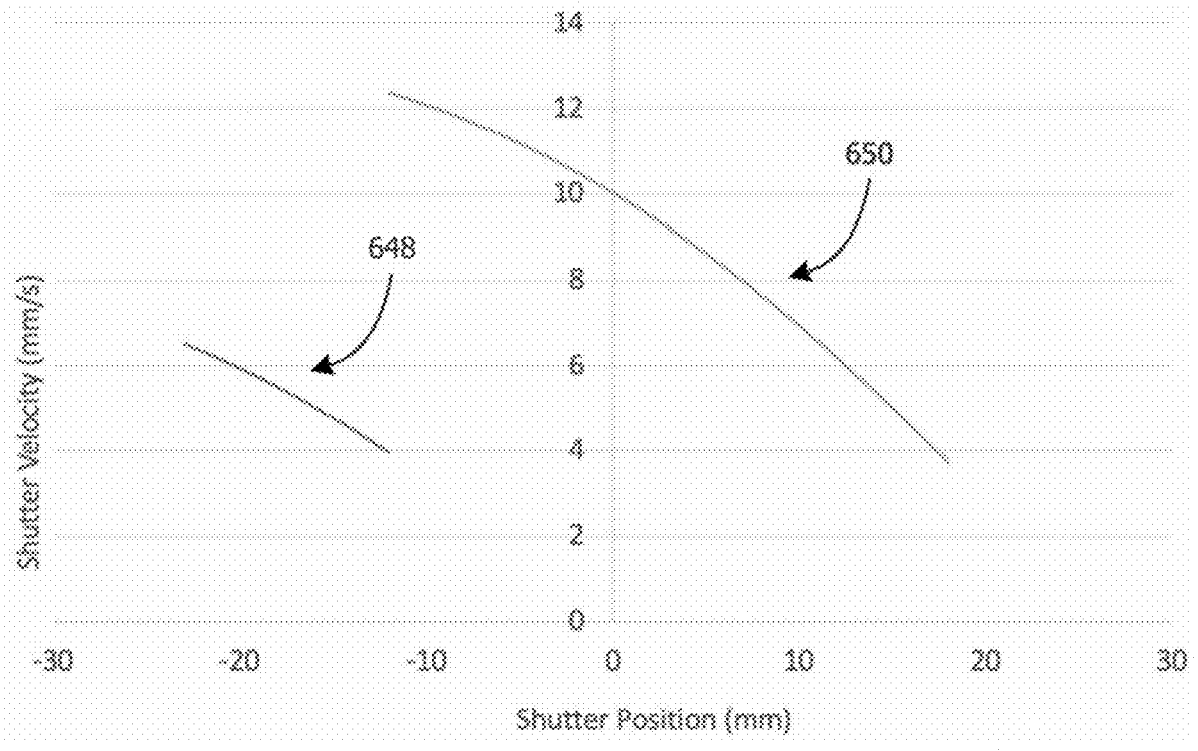

While the embodiments described with respect to FIGS. 6C to 6E relate to the calculation of a velocity profile for displacing a uniformity shutter characterised by a width that is greater than that of the vapour plume in the plane of the shutter (i.e. a 'wide' shutter), various embodiments may relate to a similar process 630 executed for a 'narrow' uniformity shutter (e.g. a shutter having a width less than that of the vapour plume). For example, FIG. 6F is an illustrative plot of an exemplary translation profile for a narrow shutter presented as the shutter velocity as a function of shutter position. In accordance with some embodiments, such a translation profile may be formatted and output 646 to an actuator for translating a narrow uniformity shutter during a deposition process. In this example, the translation profile is again calculated (e.g. fit to calculated data for a particular set of input parameters 636) as a plurality of functions, in this case two second order polynomial functions.

However, in comparison to FIGS. 6C to 6E related to the use of a wide shutter (i.e. one having a width profile sufficient to completely shield a substrate from a vapour plume), the employ of a narrow shutter results in re-exposure of portions of the substrate during a single pass of the shutter. That is, while the use of a wide uniformity shutter may require consideration of only a single exposure period for all regions of the substrate during a unidirectional shutter translation (i.e. the time leading up to when the shutter shields each region), the use of narrow shutter requires the consideration of more than one exposure period for a portion of the substrate: the time leading up when the leading edge of the shutter shields a region, and the time after which the trailing edge of the shutter passes that region. Accordingly, the two polynomial velocity profiles 648 and 650 in FIG. 6F correspond to, respectively, the portion of the substrate that is subject to re-exposure upon passage of the trailing edge of the shutter, and the portion of the substrate that only experiences one exposure period. In accordance with various embodiments, the velocity profile 648 may thus relate to lower shutter velocities to compensate or account for this additional exposure period. This may in turn relate to a larger 'gap' between the two velocity profiles 648 and 650. That is, while the two polynomial profiles of each of FIGS. 6C to 6E were arbitrarily defined in accordance with the midpoint of the substrate, the velocity profiles 648 and 650 corresponding to a narrow uniformity shutter are defined in accordance with a physically meaningful position associated with different deposition regimes, resulting in a more disjointed shutter velocity profile.

It will be appreciated that, in accordance with various embodiments, it may be preferable to begin a deposition process in accordance with a particular system configuration. For example, it may be preferred that a uniformity shutter be positioned on the side of a tilted substrate that is closest to the deposition source, thereby blocking deposition on that side of the substrate first during deposition. That is, it may be preferred that a uniformity shutter be disposed on the side of a deposition system corresponding to the side of the substrate with 'positive' tilt, in accordance with some embodiments.

Figure 7A:
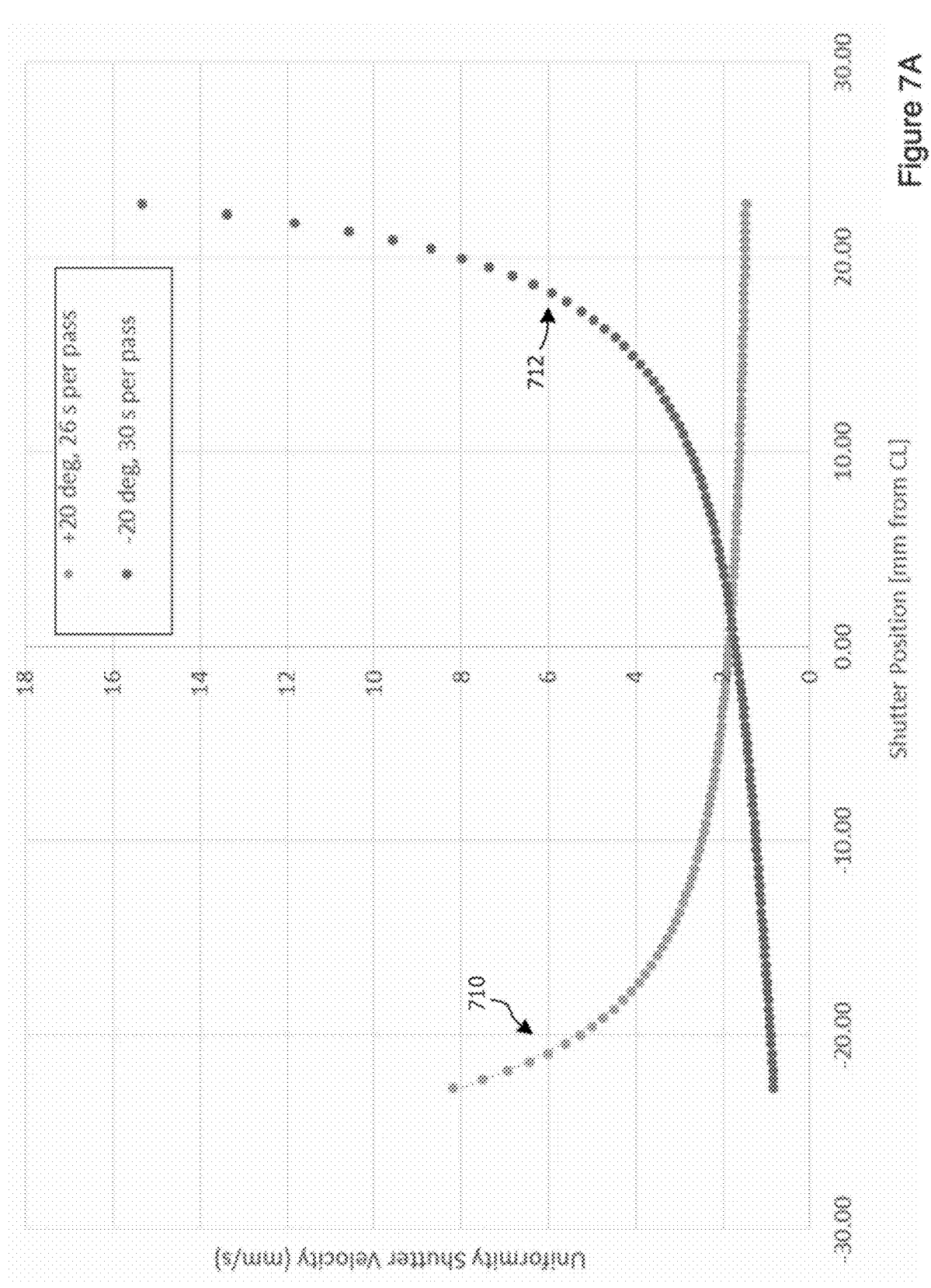
FIG. 7A is an illustrative plot of two uniformity shutter velocity profiles corresponding to a substrate tilted at +20 degrees and −20 degrees, in accordance with various embodiments.

FIG. 7A shows curves corresponding to exemplary, non-limiting velocity profiles, wherein the uniformity shutter velocity is plotted as a function of shutter position across a 100 mm wafer tilted at +20 degrees (curve 710) and −20 degrees (curve 712), with a throw distance $R_0$ of 844 mm, in accordance with one embodiment. In FIG. 7A, velocity profiles may be computed such that a pass of the uniformity shutter through a flux will take a particular amount of time to complete. By adjusting the pass duration, number of passes, and the deposition rate, a film of any thickness may be deposited over almost any designated duration. For instance, aluminum layers may be preferably deposited at a high rate to minimize impurity incorporation in the film for, for instance, JJ fabrication for use in quantum circuits. Optimisation of a uniformity shutter translation or velocity profile for high-rate deposition, in accordance with some embodiments, may therefore be advantageous. In various other embodiments, deposition rates may be controlled to yield, for instance, control of a film crystallinity (or lack thereof).

Figure 7B:
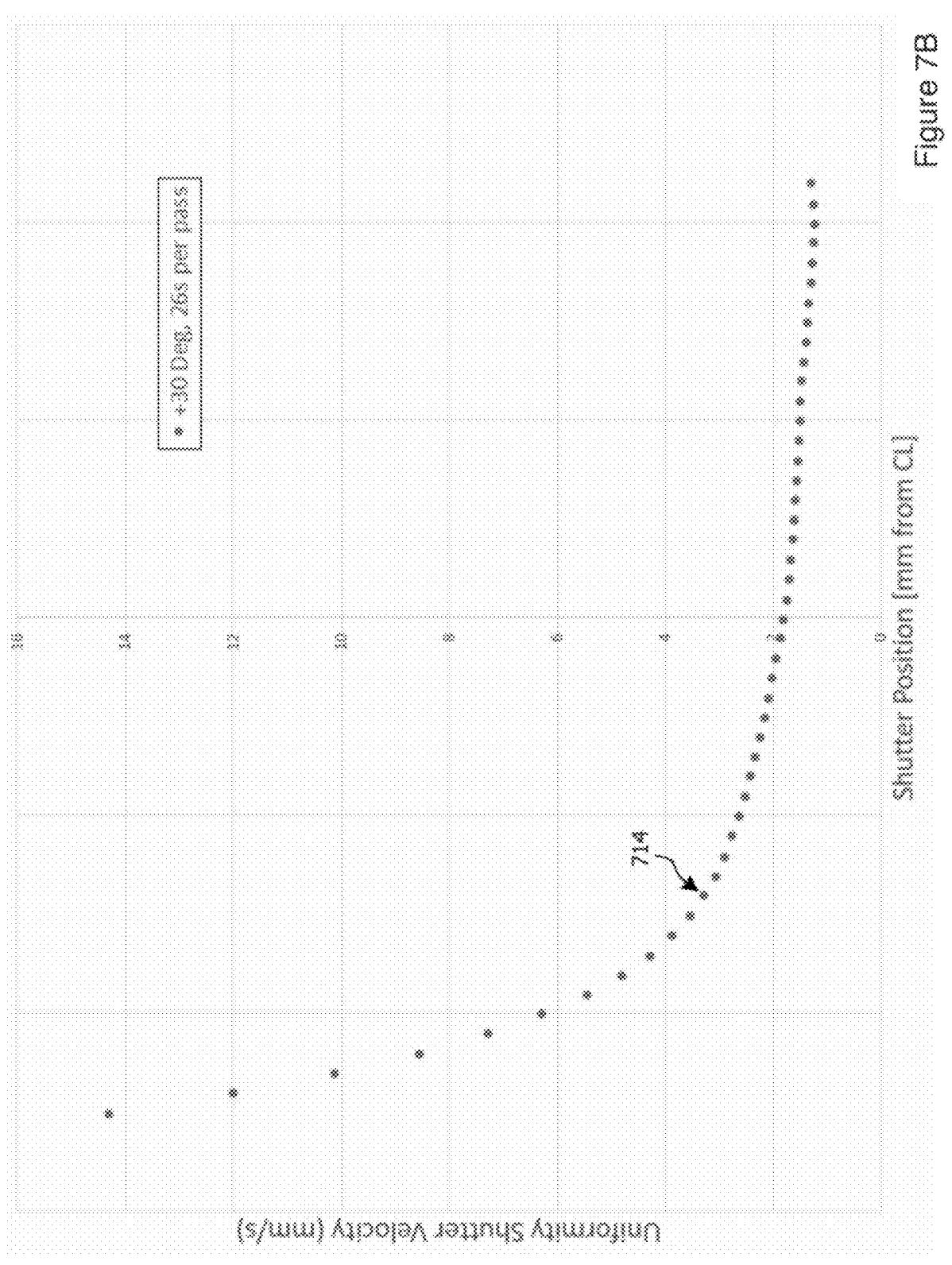
FIG. 7B is an illustrative plot of a uniformity shutter velocity profile corresponding to a substrate tilted at +30 degrees, in accordance with another embodiment.

Furthermore, and in accordance with various embodiments, a uniformity shutter may be employed in the deposition of a film on a substrate with any tilt angle by adjusting the velocity profile. For instance, FIG. 7B shows a curve 714 corresponding to a velocity profile as a function of position across a substrate tilted at +30 degrees. Furthermore, for a fixed throw distance and substrate diameter, an active shutter region geometry may be fixed (i.e. to correct for a $\cos''(\theta)$ variation in deposition rate). However, by tuning the velocity profile, the uniformity shutter may be employed for the substrate tilted at any angle relative to the emission source.

In accordance with some embodiments, a velocity profile may be calculated or approximated for a new system geometry based on known deposition properties for another system geometry. For example, if a first velocity profile is known to produce a desirable film uniformity for a first substrate tilt angle (e.g. +20 degrees), a second velocity profile may be inferred for a second substrate tilt angle (e.g. 40 degrees, −20 degrees, etc.) based on a scaling of the first velocity profile. Such calculations may be based on, for instance, theoretical models relating a known flux, system geometry, and/or velocity profile to approximate a velocity profile for any substrate angle, or may be determined or approximated based on previously validated models. In one embodiment, a shutter velocity profile for a substrate directly in front of the flux (i.e. the substrate surface normal, at the centre of the substrate and on the axis of tilt thereof, is aligned with the centre of the deposition flux) that is tilted at a "positive" angle (e.g. +20 degrees) may be reflected across the centre of the substrate (e.g. reflected about the shutter position of 0 mm in FIG. 7A) for the same "negative" angle (e.g. −20 degrees). In other embodiments, a velocity profile such as of curve 710 of FIG. 7A may be scaled as a function of tilt angle for a different substrate tilt angle. In yet other embodiments, an empirical calibration, such as that schematically illustrated in FIG. 6A or 6B, may be performed in lieu of (or in addition to) a mathematical scaling to determine a velocity profile for any tilt angle or system geometry.

Figures 8A, 8B, 8C, 8D:
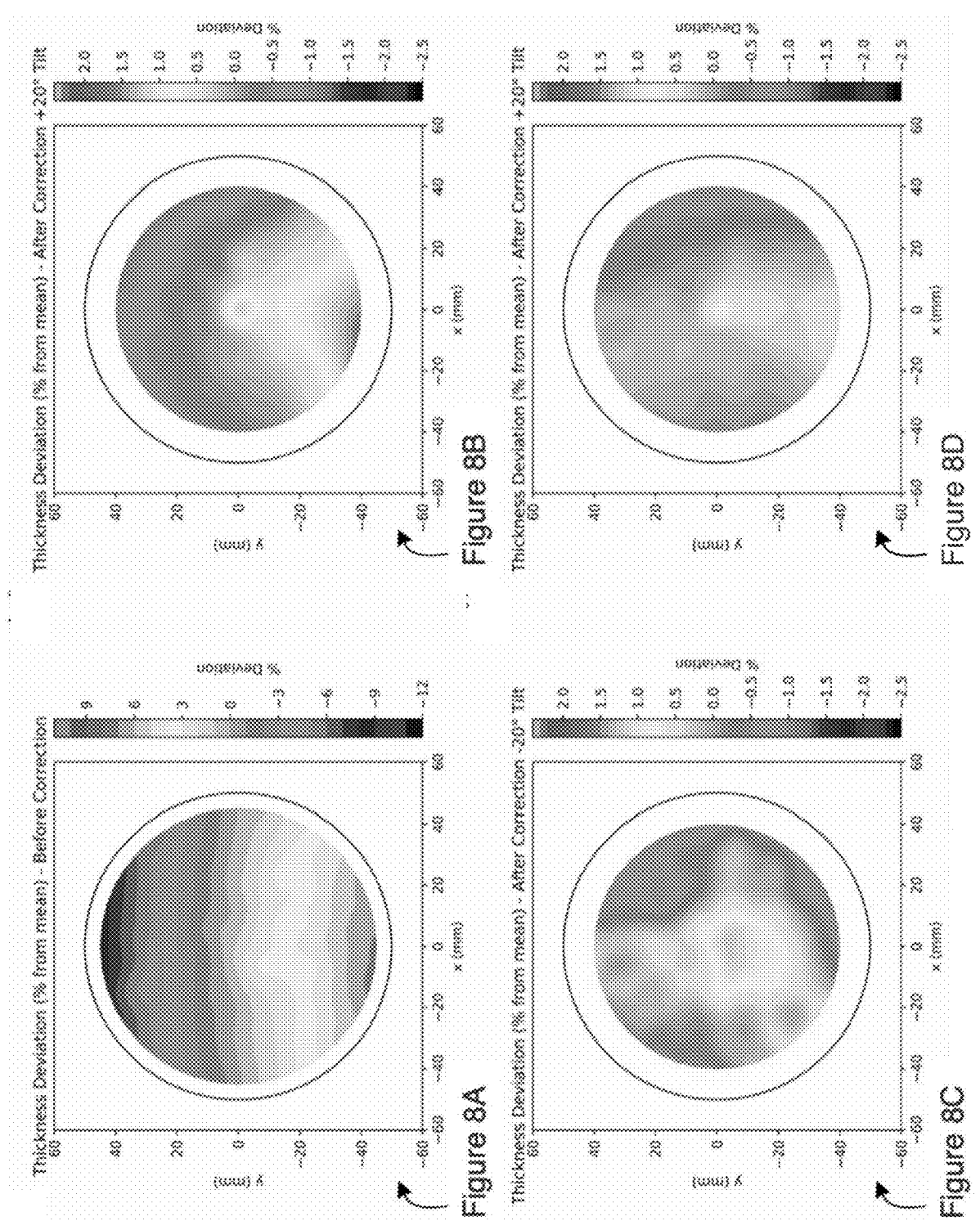
FIGS. 8A to 8D are illustrative plots of film thickness as a function of position on a substrate using different deposition conditions, in accordance with various embodiments.

The impact on film thickness uniformity using the uniformity shutter velocity profiles plotted in FIG. 7A is demonstrated, in accordance with various embodiments, in FIGS. 8A to 8D. In these examples, FIG. 8A shows the thickness of an aluminum film as a percent deviation from the average thickness of the film deposited over the entire area of the substrate tilted at +20 degrees, without the use of a uniformity shutter (i.e. under conventional deposition conditions with a tilted substrate). FIGS. 8B and 8C, on the other hand, show the uniformity of the film thickness deposited across a substrate tilted at +20 degrees and −20 degrees, respectively, but upon dynamic adjustment of a uniformity shutter according to the velocity profiles 710 and 712, respectively, through the path of material flux during deposition. FIG. 8D shows a plot of the film thickness at a tilt angle of +20 degrees with actuation of the uniformity shutter according to the velocity profile used in FIG. 8B, and with further tuning of the electron beam evaporation source uniformity. Non-uniformity in the samples of FIGS. 8A, 8B, 8C, and 8D are, respectively and in accordance with various embodiments, 11.1% (without a uniformity shutter), 1.0% (with a uniformity shutter), 1.1% (with a uniformity shutter), and 0.8% (with a uniformity shutter and with electron beam uniformity tuning).

A shutter active region and velocity profile may, theoretically, be optimised such that the thickness is perfectly uniform across the wafer (i.e. 0% non-uniformity). However, and in accordance with various embodiments, $<\pm1\%$ or $<\pm0.8\%$ may be achieved in practice with a linearly translated uniformity shutter without particularly painstaking optimisation. More rigorous optimisation may enable, in accordance with various embodiments, films characterised by a non-uniformity of $<\pm0.1\%$. However, it will be appreciated that such degrees of uniformity may relate to various factors and/or system geometries. For example, while embodiments described above relate to system configurations allowing the deposition of highly uniform films, other embodiments may relate to relatively short source-to-substrate distances (e.g. approximately 500 mm or less) and/or large substrate diameters (e.g. approximately 200 mm or greater), which may result in higher degrees of non-uniformity.

That is, linear or rotating uniformity shutter movement may correct for non-uniformity arising from the tilting of a substrate. However, such correction may allow for the realisation of a layer uniformity that relates to or is a function of layer non-uniformity at a 0-degree substrate tilt (i.e. a 'baseline' non-uniformity). Such baseline non-uniformity may arise from, for instance, geometrical factors, such as the throw distance (i.e. the distance between the source and substrate), the diameter of the substrate, the characteristics of the source, or the like.

However, a shutter geometry (e.g. curved edges) may be selected to at least partially correct for such baseline non-uniformity, in accordance with various embodiments. While there are practical limitations to how well non-uniformity may be corrected using a given shutter geometry due to, for instance, non-constant shutter speeds and effective deposition rates across a substrate, a shutter shape may nevertheless be tuned or selected to balance a uniformity correction across a substrate. For example, and in accordance with some embodiments, deposition parameters and/or shutter geometries may be selected to over-correct for layer thicknesses on one half of a substrate, under-correct on the other half, and perfectly correct in the center. In this way, and in accordance with some embodiments, non-uniformity corrections may be realised that are less than half of a baseline non-uniformity value. For example, if a baseline non-uniformity for a deposition configuration is ±6.5%, the use of a uniformity shutter may improve the non-uniformity to less that ±3%. Similarly, a baseline non-uniformity of ±2% may be improved to less than ±1%. In these examples, non-uniformity is calculated as $$\text{Non-Uniformity} = \frac{t_{max} - t_{min}}{2\,t_{avg}}$$

where $t_{max}$, $t_{min}$, and $t_{avg}$ are the maximum, minimum, and average thickness of a deposited layer, respectively. However, it will be appreciated that other metrics or equations may be employed to describe a layer uniformity.

In some embodiments, velocity profiles may be calculated or designated to produce a preferred or arbitrary thickness profile in flat substrates (substrates that are not tilted). For example, a velocity profile may be selected to deposit a film with an increasing thickness across a flat substrate. In accordance with yet other embodiments, a designated non-uniformity may be achieved with a corresponding uniformity shutter velocity profile for either tilted or flat substrates.

Furthermore, while embodiments described above relate to linearly translating a uniformity shutter along an axis that is substantially perpendicular to an axis of flux, various other embodiments relate to actuating a uniformity shutter along a translation axis that is not perpendicular to the flux. While this may affect the shape of the velocity profile required to, for instance, achieve a high degree of uniformity, spatially controlling film thickness and achieving uniformity correction are enabled in such embodiments using, for instance, the process steps of FIG. 6A or 6B. While actuating a uniformity shutter at a non-perpendicular angle to the flux may increase the challenge of correcting deposition rates at both negative and positive tilt angles with the same shutter, such a translation profile may be advantageous for some system geometries. For instance, very large substrate tilt angles (e.g. an 85-degree tilt for a GLAD film) may require extreme or impractical shutter speeds and/or accelerations. Such configurations may benefit from a non-perpendicular translation profile. However, in accordance with other embodiments, the opposite may be true. For example, the exemplary process of FIG. 6B, when performed using a 'wide' uniformity shutter, may only require small changes in velocity throughout shutter translation for high tilt angles. Conversely, for wide shutters, shallow tilt angles may require larger velocity gradients, at least in part due to the similar amount of time required to deposit a uniform thickness across all regions of a substrate. However, it will be appreciated that a tilted uniformity shutter angle may, in accordance with one embodiment, be employed to alleviate issues related to impractical shutter speeds and/or acceleration.

In accordance with some embodiments, a linear uniformity shutter may be employed to reduce non-uniformity on a flat substrate. Various approaches may be employed for mitigating the effects of $\cos^n \theta$ and $1/R^2$ variation on uniformity for such configurations, such as disposing the substrate off-centre from an emission source, subjecting the substrate to a rotary planetary motion, increasing the throw distance to the substrate, or the like. However, if a particular deposition system configuration is preferred (e.g. if it desirable to dispose the substrate "on-axis", or it is undesirable to increase the throw distance for material utilisation purposes, or the like), a linear uniformity shutter may be employed to address uniformity in deposition rate across a substrate without altering the system geometry.

Figure 9A:
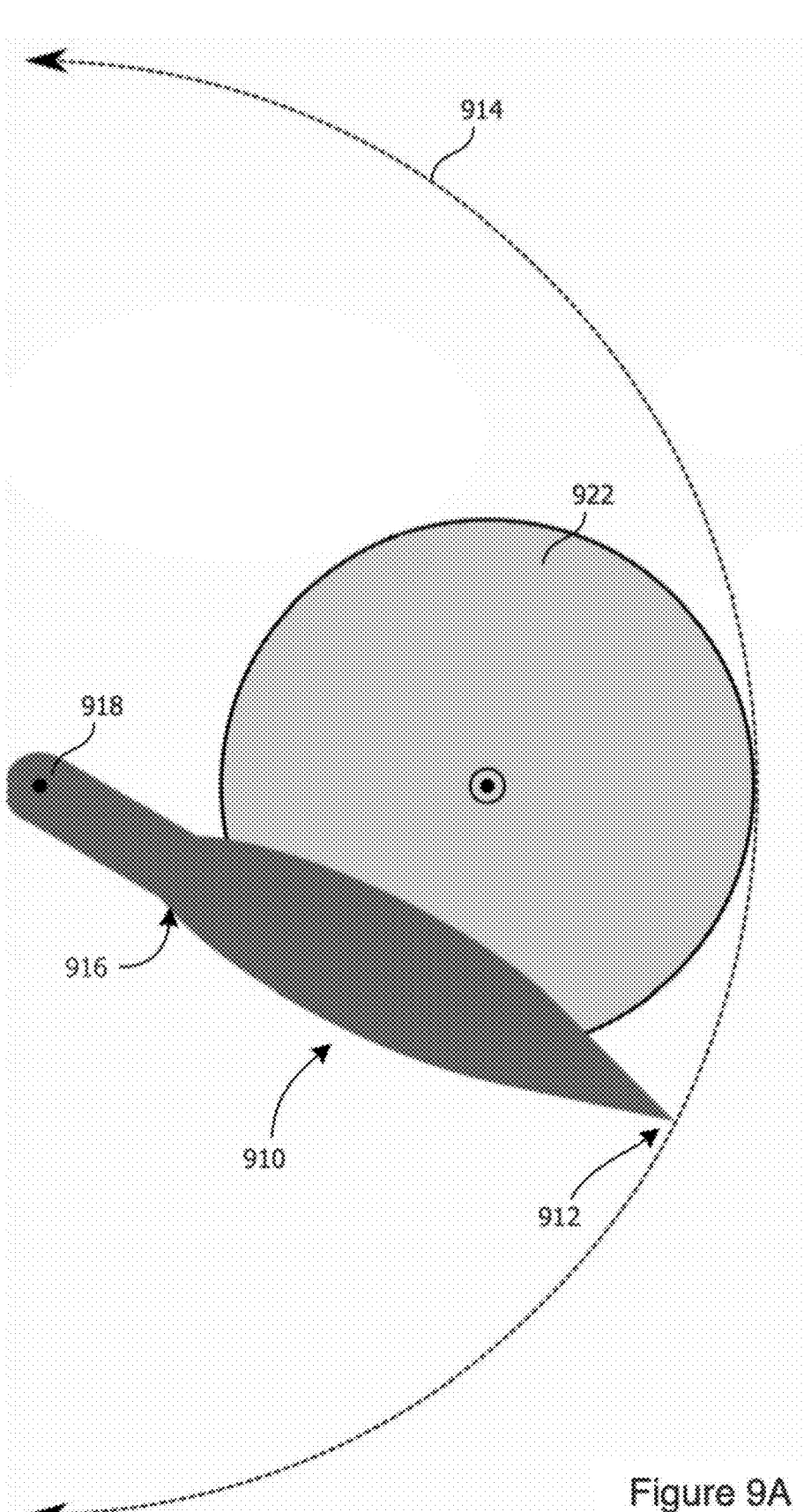
FIGS. 9A and 9B are schematic diagrams of a rotationally actuated uniformity shutters, in accordance with various embodiments.

In accordance with various other embodiments, a film thickness and/or uniformity may be controlled using a uniformity shutter, and/or corresponding translation or velocity profile, configured for rotational translation/motion. For instance, and as schematically depicted in FIG. 9A, a uniformity shutter 910 may comprise a shape akin to that of an elongated oval with a rounded or pointed tip 912 at an end thereof. Further, and in accordance with various embodiments, a rotational uniformity shutter 910 may translate, be actuated, or otherwise move according to a naturally polar coordinate system (e.g. in an arc or circular fashion 914, or the like). In this non-limiting example, the inner portion 916 of the oval geometry is oriented along the mid-line of the uniformity shutter 910 towards an axis of rotation 918. In accordance with one embodiment, the axis 918 may comprise the uniformity shutter axis 222 of FIG. 2.

In the embodiment depicted in FIG. 9A, the furthest point of the uniformity shutter from the axis of rotation 918 is a pointed edge 912. For embodiments related to a system or method for providing a uniform film thickness, the wider portion of the shutter 910 (i.e. the portion of the oval shutter 910 closer towards the axis 918, in this example) may correspond to the edge of a substrate that is tilted towards the vapor source (i.e. where the flux 922 is relatively high). The pointed portion 912 of the shutter may conversely correspond to the edge a substrate or wafer that is tilted away from the vapor source. Accordingly, areas of the substrate exposed to a low flux (i.e. farther from an emission source, where the deposition rate is lower) will be blocked by a narrower portion of a shutter 910 (i.e. for a shorter duration) during passage of the shutter 910 in an arc 914 across the substrate, thereby producing a more uniform film thickness. In accordance with various embodiments, a rotational shutter 910 may thus comprise a uniform angular velocity profile (e.g. a constant angular velocity) for providing a uniform thickness.

Figure 9B:
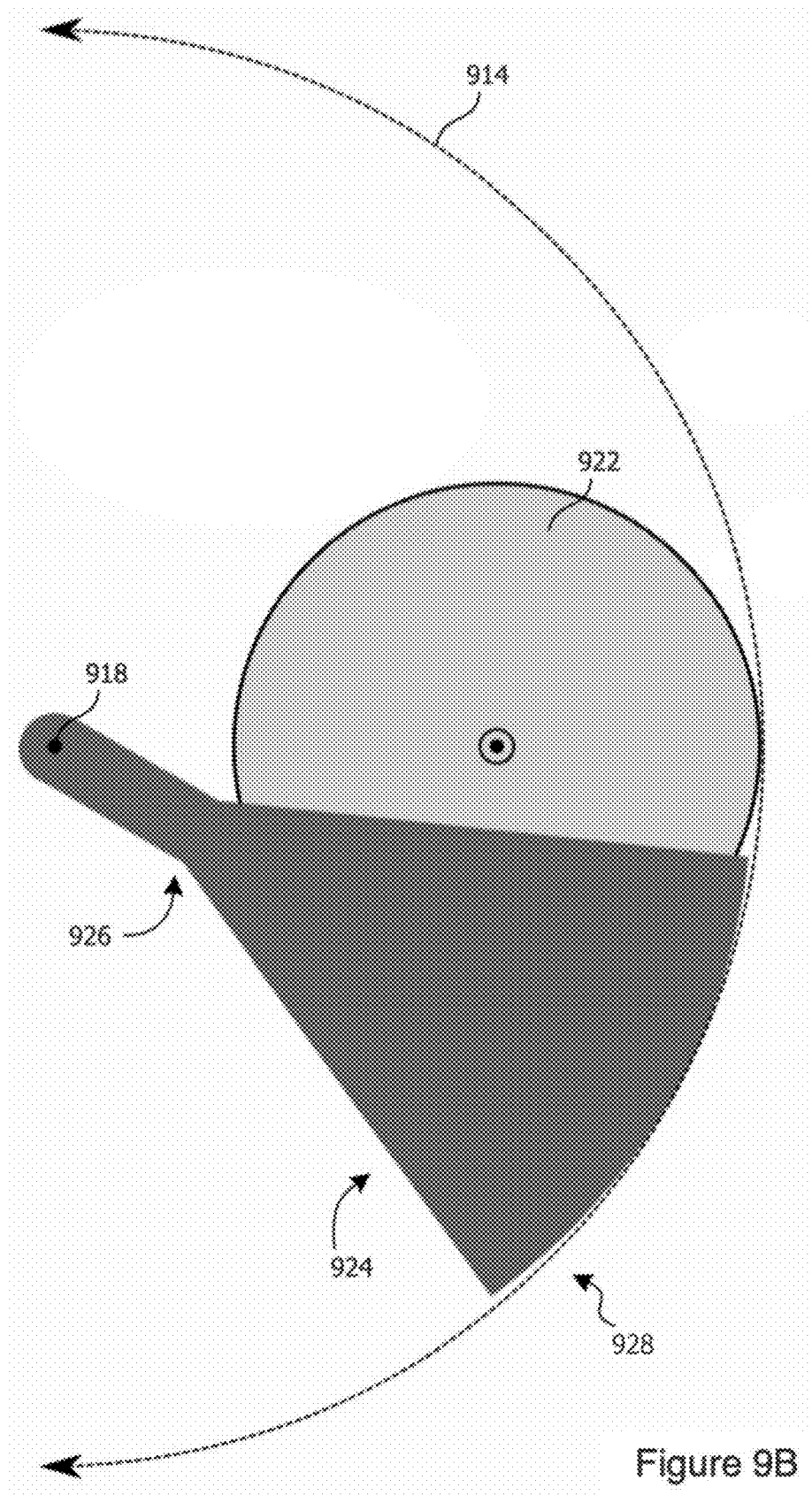

In accordance with another embodiment, FIG. 9B shows a rotational uniformity shutter 924 having a different geometry from the rotational shutter 910 of FIG. 9A. In this non-limiting example, the shutter 924 comprises a shape akin to that of a circular sector having a narrower region 926 closer to the rotational axis 918, and a wider edge region 928 further from the axis 918. In accordance with various embodiments, various different geometries of uniformity shutters may be employed depending on, for instance, a flux profile 922, different deposition rates arising from different substrate tilt angles or system geometries, and/or a designated dynamic shutter path 914.

In the exemplary embodiment illustrated in, for instance, FIG. 9A, a rotational uniformity shutter 910 may correct for thickness variation arising due to tilting, but may not correct for a $\cos'' \theta$ and $1/R^2$ variation in thickness across a substrate with an extended dimension in the non-titled axis, as described by, for instance, Equation 1. However, the geometry of the uniformity shutter 910 may be designed, in accordance with various embodiments, to correspond to a particular system parameter, such as a desired tilt angle for a particular application. In accordance with some embodiments, a process employing such a shuttering system may comprise tilting a substrate in a first direction, and then rotating the sample 180 degrees in order to achieve a high degree of uniformity in a second angled deposition, such as that shown in FIG. 1D.

Figures 10A, 10B:
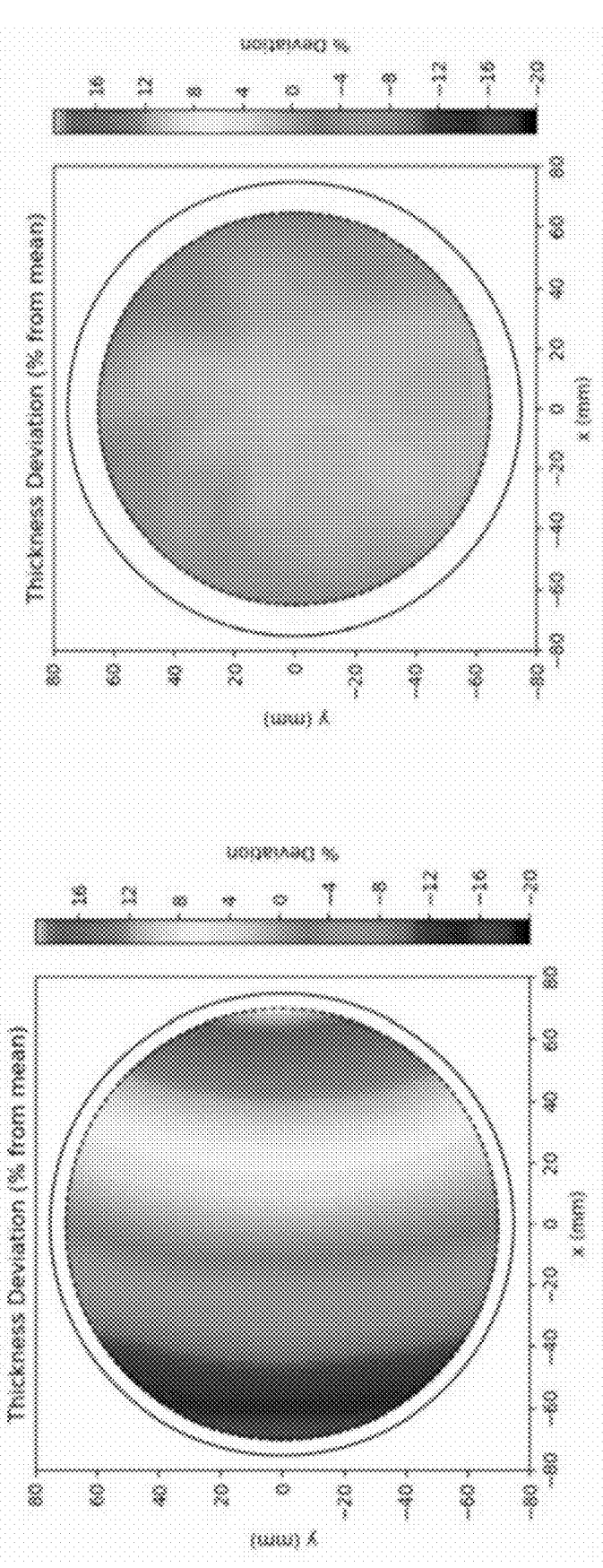
FIG. 10A is an illustrative plot of film thickness deposited on a tilted substrate in the absence of a uniformity shutter.
FIG. 10B is an illustrative plot of film thickness deposited on a tilted substrate using a rotationally actuated uniformity shutter, in accordance with various embodiments.

In accordance with various embodiments, the impact on film thickness uniformity using the rotational uniformity shutter 910 of FIG. 9A is shown in FIGS. 10A and 10B. In this example, an aluminum layer was deposited on a 150 mm diameter wafer substrate tilted at +30 degrees with a throw distance $R_0$ of 782 mm. FIG. 10A shows a plot of the thickness of the film deposited at each location of the substrate without the use of a uniformity shutter (i.e. under conventional deposition conditions with a tilted substrate), resulting in a non-uniformity of 18%. FIG. 10B, on the other hand, shows the uniformity of the film thickness deposited across the substrate upon dynamic adjustment of the rotational uniformity shutter. The non-uniformity of the film thickness of FIG. 10B is <2.5%.

While the above-described exemplary embodiments of a rotational uniformity shutter relate to the deposition of a film on a tilted substrate, other embodiments relate to spatially controlling deposition of a film on a flat substrate while dynamically adjusting a uniformity shutter according to a rotational translation and/or velocity profile.

Figure 11:
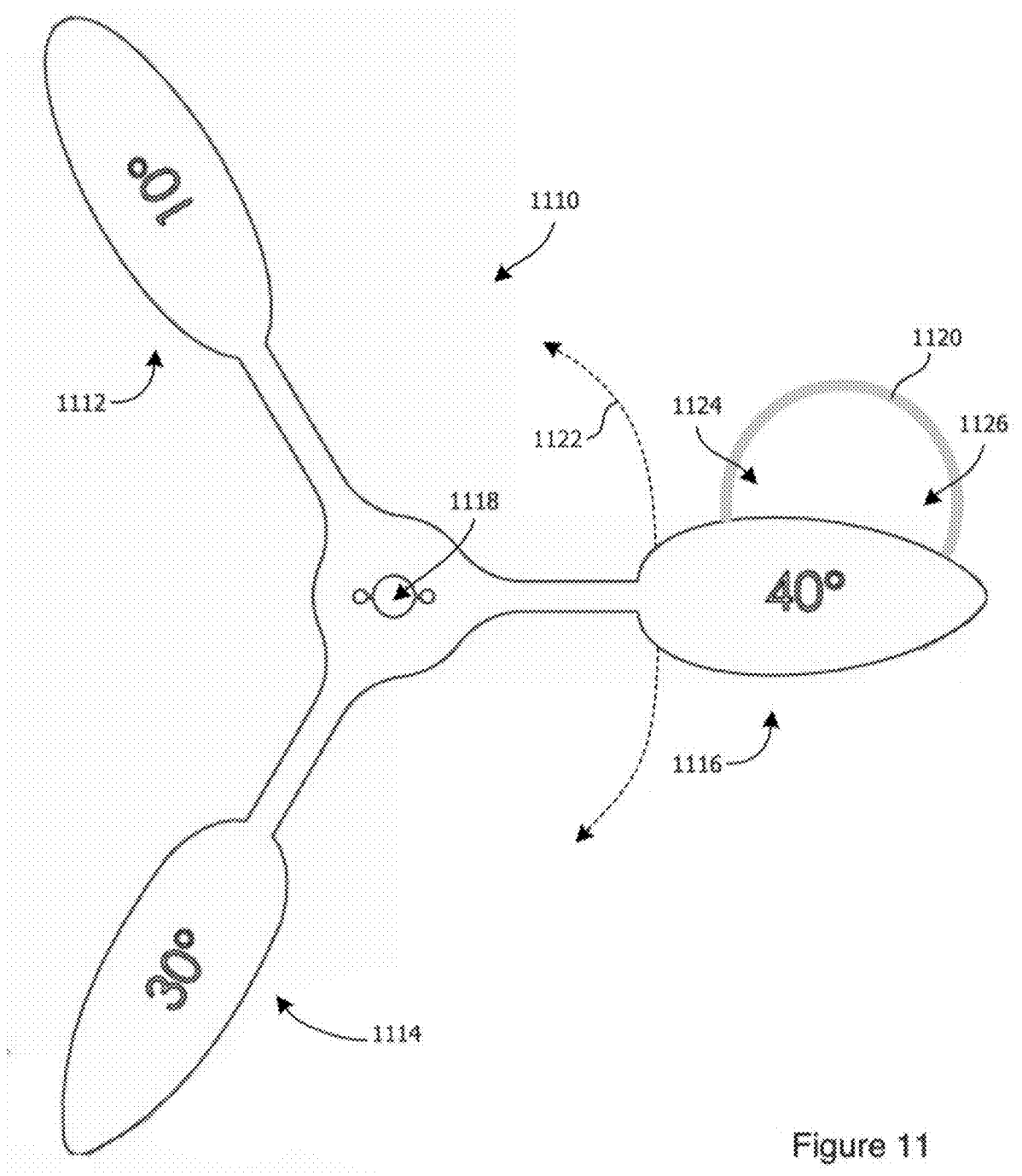
FIG. 11 is a schematic diagram of a modular uniformity shutter, in accordance with various embodiments.

In accordance with other embodiments, a rotational uniformity shutter may comprise various geometries that correspond to, for instance, various substrate tilt angles. While some embodiments relate to individual shuttering systems comprising a designated shutter geometry, other embodiments relate to a uniformity shutter comprising more than one shutter geometry to accommodate, for instance, different substrate angles. One embodiment of such a modular uniformity shutter is schematically illustrated in FIG. 10. In this non-limiting example, a rotational uniformity shutter 1110 comprises three shuttering modules having respective geometries 1112, 1114, and 1116 corresponding to preferred tilt angles of 10 degrees, 30 degrees, and 40 degrees, respectively. In this embodiment, a particular geometry may be selected based on a desired tilt angle by, for instance, rotating the uniformity shutter 1110 about an axis 1118 so to dispose the appropriate shutter near or within a flux 1120. In FIG. 11, the module having geometry 1116 corresponding to a 40-degree tilt angle is selected, which may then be actuated to pass through a flux 1120 in, for instance, an arc-like path 1122.

In this example, the geometry 1116 is disposed relative to a flux 1120 such that, when actuated for an application in which a high degree of uniformity is preferred, the wider portion of the geometry 1116 passes through a region of high flux 1124. In accordance with some embodiments, region 1124 corresponds to a region of high deposition rate on a tilted substrate (e.g. the region of the substrate that is nearest to an emission source when the substrate is tilted). Conversely, the narrower region of the geometry 1116 passes through the region 1126 of flux that results in a lower deposition rate, thereby blocking less depositing material and providing a uniform film thickness across the substrate.

While the embodiment disclosed in FIG. 11 relates to a rotational uniformity shutter comprising a modular geometry in which one of various modules may be selected for dynamic rotational actuation, various other embodiments relate to comparable modular designs configured for actuation according to a linear translation profile. For instance, the uniformity shutter 510 of FIG. 5 may be further configured, in accordance with some embodiments, to provide various active shutter regions similar to region 512, but comprising different geometries corresponding to, for instance, different throw distances $R_0$, substrate diameters, or relative positions (e.g. height at which a uniformity shutter intersects a flux). For example, different active regions (modules) may comprise respective variable width profiles 514 having different tapering angles. Such modules may, in some embodiments, be laterally spaced apart, but coupled therebetween, so to be actuated by a common actuator or coupling region 532. Such a configuration may enable selection of an appropriate geometry for a particular throw distance, and subsequent actuation through a flux according to a designated linear velocity or translation profile. In accordance with some embodiments, such a modular linear uniformity shutter may be included in deposition system in which a throw distance may be adjusted, for instance via an actuated substrate holder or emission source.

Whether related to linearly or rotationally translating uniformity shutters, an active region, or blade, of a modular system, once selected and/or oriented, may be rastered across a deposition plume for a particular system configuration, in accordance with various embodiments. While the embodiment described in FIG. 11 comprises three geometries, various other embodiments relate to configurations which allow for uniformity control with any number of modules, provided that there is sufficient space between units such that non-relevant modules do not interfere with deposition control from a selected module (unless that interference is predictable and/or accounted for during deposition).

Furthermore, while the different geometries of the uniformity shutter 1110 lie on a common plane in FIG. 11, a rotational or linearly actuated uniformity shutter, in accordance with various embodiments, may comprise components that are oriented on different planes. Such configurations may, for instance, have increased compactness for ready integration within the confines of a deposition system, while still allowing for selection of a particular module in a preferred orientation relative to a flux profile during deposition.

Figure 12:
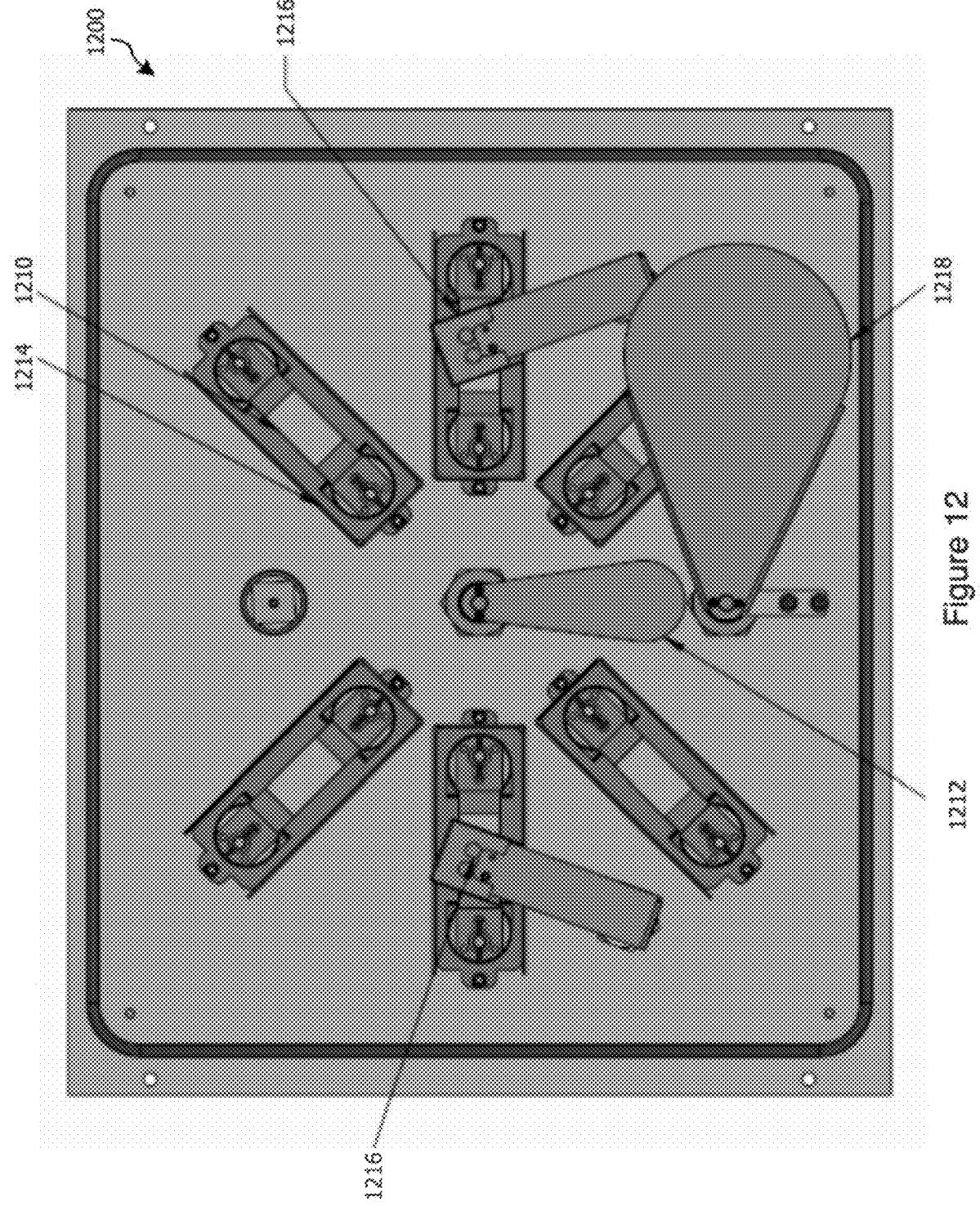
FIG. 12 is a schematic diagram of a deposition system comprising a uniformity shutter configured to dynamically adjust deposition flux from a plurality of sources, in accordance with various embodiments.

In accordance with yet other embodiments, a uniformity shutter may be dynamically adjusted during deposition to control a deposition rate on a substrate (or a plurality of substrates) arising from a plurality of deposition sources (e.g. thermal sources). For example, FIG. 12 schematically illustrates a deposition system 1200 comprising six resistive sources 1210 arranged in an approximately hexagonal configuration about a rotational uniformity shutter 1212. In accordance with various embodiments, the system may further comprise one or more substrates or substrate holders (e.g. six substrate holders, each corresponding to a respective deposition source), which may optionally be configurable to maintain a substrate at an angle with respect to one or more of the plurality of sources 1212. The skilled artisan will appreciate that the particular configuration of a deposition system 1200 may further comprise elements known in the art of systems enabling the deposition of thin films, such as deposition shields 1214. Furthermore, and in accordance with some embodiments, sensors 1216 may be operable to measure fluxes (or deposited film thickness), as described above, and one or more substrate shutters 1218 may be employed to block a flux from arriving at a substrate, depending on the demands of a particular application. For instance, the substrate shutter 1218 may be rotated to block deposition sources 1210 one shutter at a time, or to block a plurality of sources 1210 in embodiments comprising a plurality of substrate shutters.

In at least some exemplary embodiments, a single rotational (or linear) uniformity shutter 1212 may be rotationally actuated (or linearly actuated) to address a designated deposition source 1210, and subsequently, during deposition, be dynamically actuated according to a translation or velocity profile to block flux emitted by a designated source 1210 and thereby control a deposition rate (and therefore a film thickness) on a substrate (or substrates). In embodiments in which a uniformity shutter comprises a plurality of active shutter (i.e. flux-blocking) regions, a plurality of sources may be addressed simultaneously via a single actuator during deposition, so to concurrently control film thickness on a corresponding plurality of substrates. In accordance with some embodiments, the geometry of the uniformity shutter 1212 may be designated so to produce a uniform film thickness (e.g. a non-uniformity on a substrate of <1%) upon actuation during deposition. In some embodiments, each "blade" of a uniformity shutter comprising a plurality of active regions (i.e. blades) may comprise a geometry corresponding to a designated or desired film thickness property (e.g. uniformity), which may be determined from, for instance, iterative calibration processes for a particular system geometry.

Embodiments such as those schematically depicted in FIG. 12 may comprise one or more sources 1210 that are "off-centre" with respect to a substrate (e.g. when depositing on a single substrate located between the sources 1210). While such system configurations may be less desirable in, for instance, JJ fabrication, they may be of interest for other applications, such as those employing off-axis sputtering, or glancing angle deposition.

In accordance with some embodiments, a linearly actuated uniformity shutter may be employed to control a film thickness deposition with multiple sources. For instance, while the configuration of sources 1210 in FIG. 12 are arranged with a rotational symmetry, sources may alternatively be configured with a linear symmetry (e.g. two or more sources in a line). In such embodiments, a linear uniformity shutter may be translated to address respective sources one at a time for deposition on one or more substrates, or a shutter may be shared by multiple sources in the same path. Furthermore, sources may, in some embodiments, be paired with respective linear uniformity shutters.

In accordance with various embodiments, velocity profiles may be calibrated independently for any one or more sources, as described above.

In accordance with yet further embodiments, a velocity profile and/or uniformity shutter geometry may be selected employed to deposit films with a controlled thickness on non-planar substrates (e.g. spherical substrates, cylindrical substrates, or the like). Further, and in accordance with various embodiments, a linear or rotational uniformity shutter may be configurable to spatially control a film thickness on a substrate that is stationary, rotating (e.g. spinning about an axis but remaining in the same location), orbiting about a rotational axis, centred directly above or below a deposition source, off-axis from a deposition source, or a combination thereof.

In accordance with various embodiments, the frequency of motion of the uniformity shutter may be such that at least one complete pass, or many (>10) full or partial passes, may be performed during deposition of a layer to achieve a designated or satisfactory uniformity. For instance, and in accordance with various embodiments related to uniformity shutters having either linear or rotational velocity profiles, a low number of partial passes (e.g. <10 passes) may result in non-uniformity in film thicknesses arising from incomplete protection from flux across all areas of the substrate. That is, a partial pass may result in some areas being blocked more than others for a particular shutter geometry. However, upon a sufficient number of passes (e.g. >10 passes, >20 passes, etc.), the effects of a partial pass may be negligible compared to, for instance, the average film thickness across a substrate, and a non-integer number of passes may be satisfactory for providing a designated film uniformity, in accordance with some embodiments.

Figure 13:
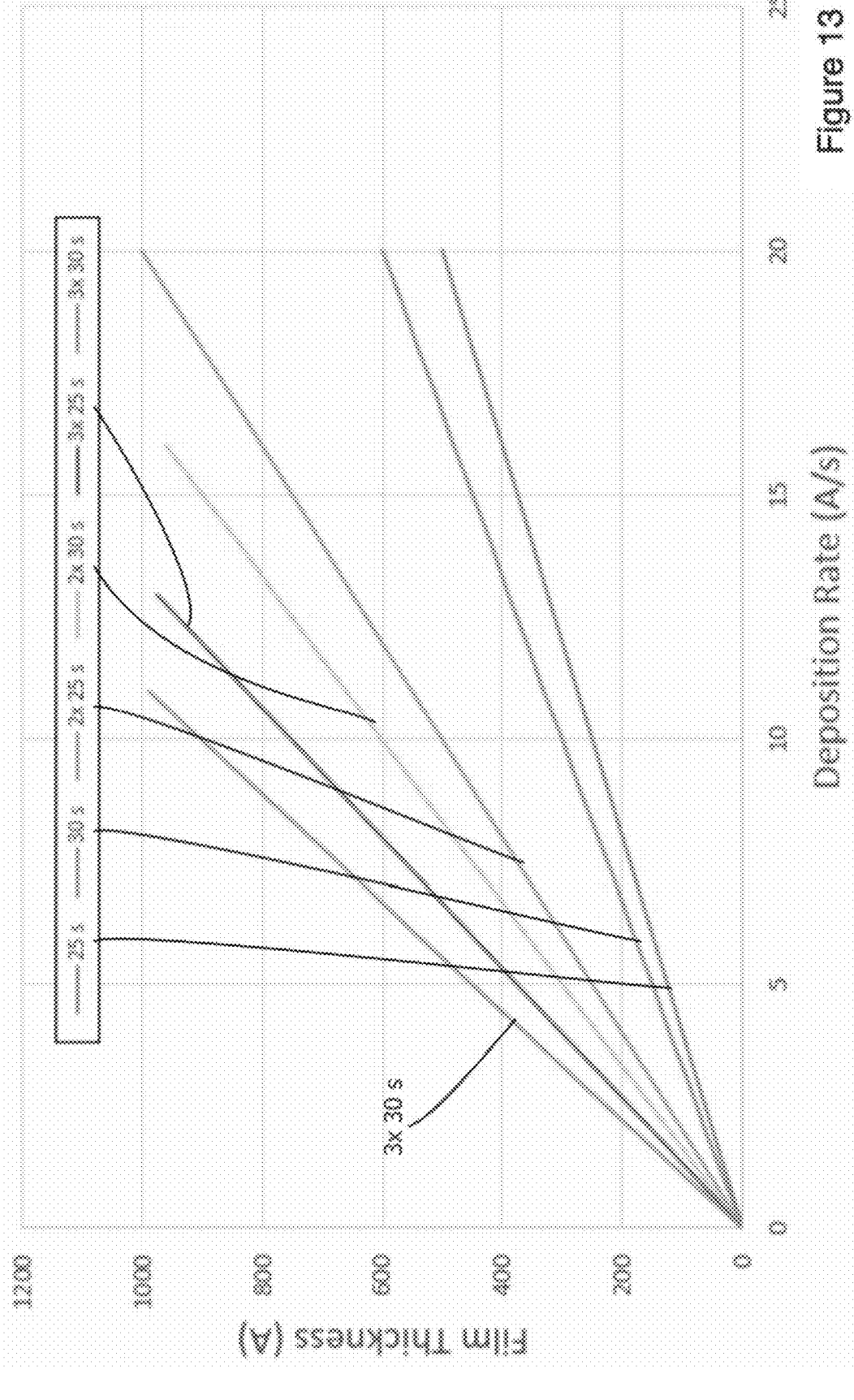
FIG. 13 is an illustrative plot of deposited film thickness versus deposition rate for various uniformity shutter pass conditions, in accordance with various embodiments.

Furthermore, and in accordance with various embodiments, a desired film thickness may be deposited at a predictable deposition rate according to a selected duration of a pass of the uniformity shutter across the substrate, and/or a number of passes across the substrate. For instance, FIG. 13 shows various curves relating a resulting film thickness versus deposition rate for single passes of 25 s and 30 s, two passes (2×) of 25 s and 30 s, and three passes (3×) of 25 s and 30 s. Such curves may enable a user to deposit, for instance, a uniformity-corrected film of any thickness using very few velocity profile calibration steps. Further, a user may consult a small number of thickness plots, such as those of FIG. 12, to determine a rate at which to use a designated velocity profile in order to achieve a desired thickness.

While the present disclosure describes various embodiments for illustrative purposes, such description is not intended to be limited to such embodiments. On the contrary, the applicant's teachings described and illustrated herein encompass various alternatives, modifications, and equivalents, without departing from the embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

Information as herein shown and described in detail is fully capable of attaining the above-described object of the present disclosure, the presently preferred embodiment of the present disclosure, and is, thus, representative of the subject matter which is broadly contemplated by the present disclosure. The scope of the present disclosure fully encompasses other embodiments which may become apparent to those skilled in the art, and is to be limited, accordingly, by nothing other than the appended claims, wherein any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims. Moreover, no requirement exists for a system or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, work-piece, and fabrication material detail may be made, without departing from the spirit and scope of the present disclosure, as set forth in the appended claims, as may be apparent to those of ordinary skill in the art, are also encompassed by the disclosure.

What is claimed is:

1. A vapour deposition system for spatially controlling a deposited film thickness on a substrate, the vapour deposition system comprising:

an emission source to emit a deposition flux along a deposition flux axis;

a substrate holder configurable to position the substrate at a designated angle relative to said deposition flux axis; and a translatable shutter comprising a flux barrier disposed between said emission source and the substrate and operable to translate said flux barrier through said deposition flux according to a designated linear translation designated to spatially control the deposited film thickness, wherein said flux barrier comprises an active flux-blocking region having a curved leading edge, wherein said translatable shutter further comprises an actuator operable to translate said flux barrier according to said designated linear translation at a non-uniform linear velocity;

wherein a curvature of said curved leading edge and said non-uniform linear velocity are designated as a function of said designated angle to enhance a uniformity of the deposited film thickness; and wherein said active flux-blocking region further comprises a curved tailing edge to act as an opposed leading edge to operate said flux barrier as a bi-directional shutter;

wherein said actuator translates said flux barrier via an unobstructive actuation arm coupled to said active flux-blocking region so not to interfere with either of said leading edge or said tailing edge.

2. The vapour deposition system of claim 1, wherein said non-uniform linear velocity and said curvature correspond to a spatially defined non-uniformity of deposition on the substrate.

3. The vapour deposition system of claim 1, wherein said linear translation is applied in accordance with a translation axis that is substantially perpendicular to said deposition flux.

4. The vapour deposition system of claim 1, wherein said flux barrier comprises a non-uniform width profile, wherein said non-uniform width profile corresponds to said designated angle.

5. The vapour deposition system of claim 1, wherein said substrate holder is configurable to position the substrate at multiple designated angles relative to said deposition flux axis, wherein said flux barrier comprises a plurality of barrier modules, each one of which comprising a respective leading edge curvature corresponding to a respective one of said multiple designated angles.

6. The vapour deposition system of claim 1, further comprising digital data storage component having stored thereon said designated linear translation, the vapour deposition system further comprising a digital data processor operable to execute translation of said flux barrier via said actuator.

7. The vapour deposition system of claim 1, wherein said enhanced uniformity comprises a uniformity enhancement relative to a baseline deposition layer uniformity.

8. The vapour deposition system of claim 1, wherein said active flux-blocking region comprises a tapered rectangular portion defined by said leading edge curvature and said curved tailing edge.

9. The vapour deposition system of claim 8, wherein said tapered rectangular portion is dimensioned and translatable to block an entirety of the substrate from said deposition.

10. The vapour deposition system of claim 1, wherein said leading edge and said tailing edge are defined by respective distinct curvatures.

11. The vapour deposition system of claim 10, wherein said respective distinct curvatures are designated for respective distinct designated angles.

12. The vapour deposition system of claim 1, wherein translation of said flux barrier according to said designated linear translation is triggered by one of an elapsed initial deposition time or a measured initial deposition accumulation.

13. The vapour deposition system of claim 1, wherein the system is operable to fabricate a Josephson Junction.

14. The vapour deposition system of claim 13, wherein the Josephson Junction comprises two aluminum vapour deposition layers.

15. The vapour deposition system of claim 1, wherein said non-uniform linear velocity is a defined by a polynomial velocity profile.

16. The vapour deposition system of claim 15, wherein said polynomial velocity profile comprises at least one polynomial velocity profile for said designated linear translation for a first half of the substrate and a distinct polynomial velocity profile for said designated linear translation for a second half of the substrate.

17. The vapour deposition system of claim 1, wherein said actuation arm is disposed on an inactive side of said active flux-blocking region so not to interfere with either of said leading edge or said tailing edge.

18. The vapour deposition system of claim 1, wherein said actuator translates said flux barrier via a pair of actuation arms disposed on respective inactive sides of said active flux-blocking region so not to interfere with either of said leading edge or said tailing edge.

*  *  *  *  *